(12) United States Patent
Kim

(10) Patent No.: US 9,490,162 B2
(45) Date of Patent: *Nov. 8, 2016

(54) USE OF DIELECTRIC SLOTS FOR REDUCING VIA RESISTANCE IN DUAL DAMASCENE PROCESS

(71) Applicant: Texas Instruments Incorporated, Dallas, TX (US)

(72) Inventor: Tae Seung Kim, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/740,374

(22) Filed: Jun. 16, 2015

(65) Prior Publication Data

US 2015/0287631 A1 Oct. 8, 2015

Related U.S. Application Data

(63) Continuation of application No. 14/501,338, filed on Sep. 30, 2014, now Pat. No. 9,087,824.

(60) Provisional application No. 61/916,840, filed on Dec. 17, 2013.

(51) Int. Cl.
*H01L 21/76* (2006.01)
*H01L 21/768* (2006.01)
*H01L 23/48* (2006.01)
*H01L 23/528* (2006.01)

(52) U.S. Cl.
CPC ... *H01L 21/76813* (2013.01); *H01L 21/76807* (2013.01); *H01L 23/481* (2013.01); *H01L 23/528* (2013.01); *H01L 2924/0002* (2013.01)

(58) Field of Classification Search
None
See application file for complete search history.

(56) References Cited

U.S. PATENT DOCUMENTS

| 6,265,308 B1 | 7/2001 | Bronner et al. |
| 7,989,336 B2 | 8/2011 | Tang et al. |
| 9,087,824 B2 * | 7/2015 | Kim ...................... H01L 23/481 |
| 2003/0008490 A1 | 1/2003 | Xing et al. |
| 2014/0117442 A1 | 5/2014 | Lee et al. |

* cited by examiner

*Primary Examiner* — Scott B Geyer
(74) *Attorney, Agent, or Firm* — Jacqueline J. Garner; Frank D. Cimino

(57) ABSTRACT

An integrated circuit may include dual damascene interconnects formed using a via-first dual damascene process or a trench-first dual damascene process. The via-first process may be a partial-via-first process or a full-via-first process. A trench mask for a wide interconnect line which is at least twice as wide as a dual damascene via in the wide interconnect line may have a dielectric slot adjacent to the dual damascene via. The dual damascene via is laterally separated from the dielectric slot by no more than half a width of the dual damascene via.

14 Claims, 25 Drawing Sheets

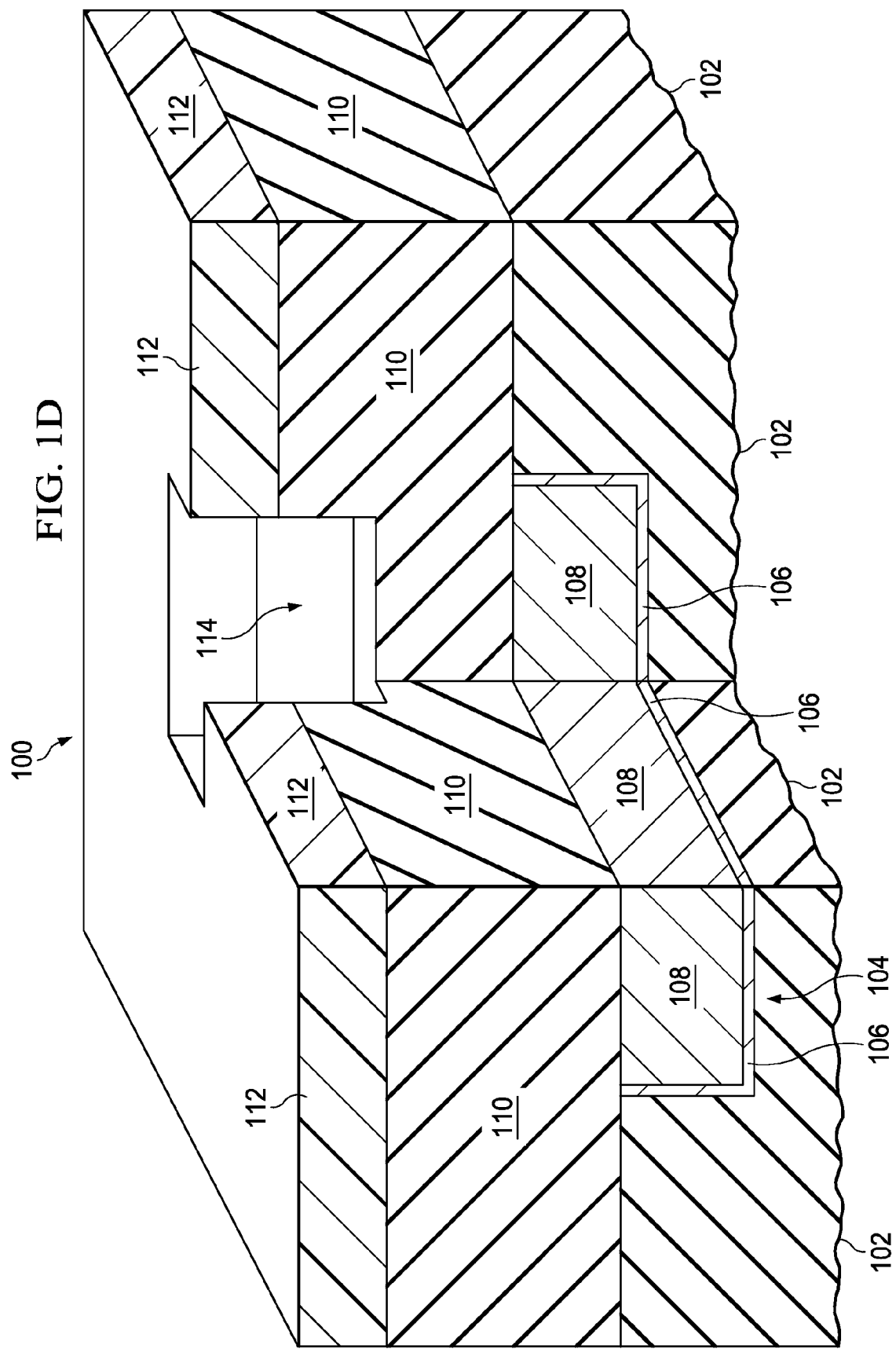

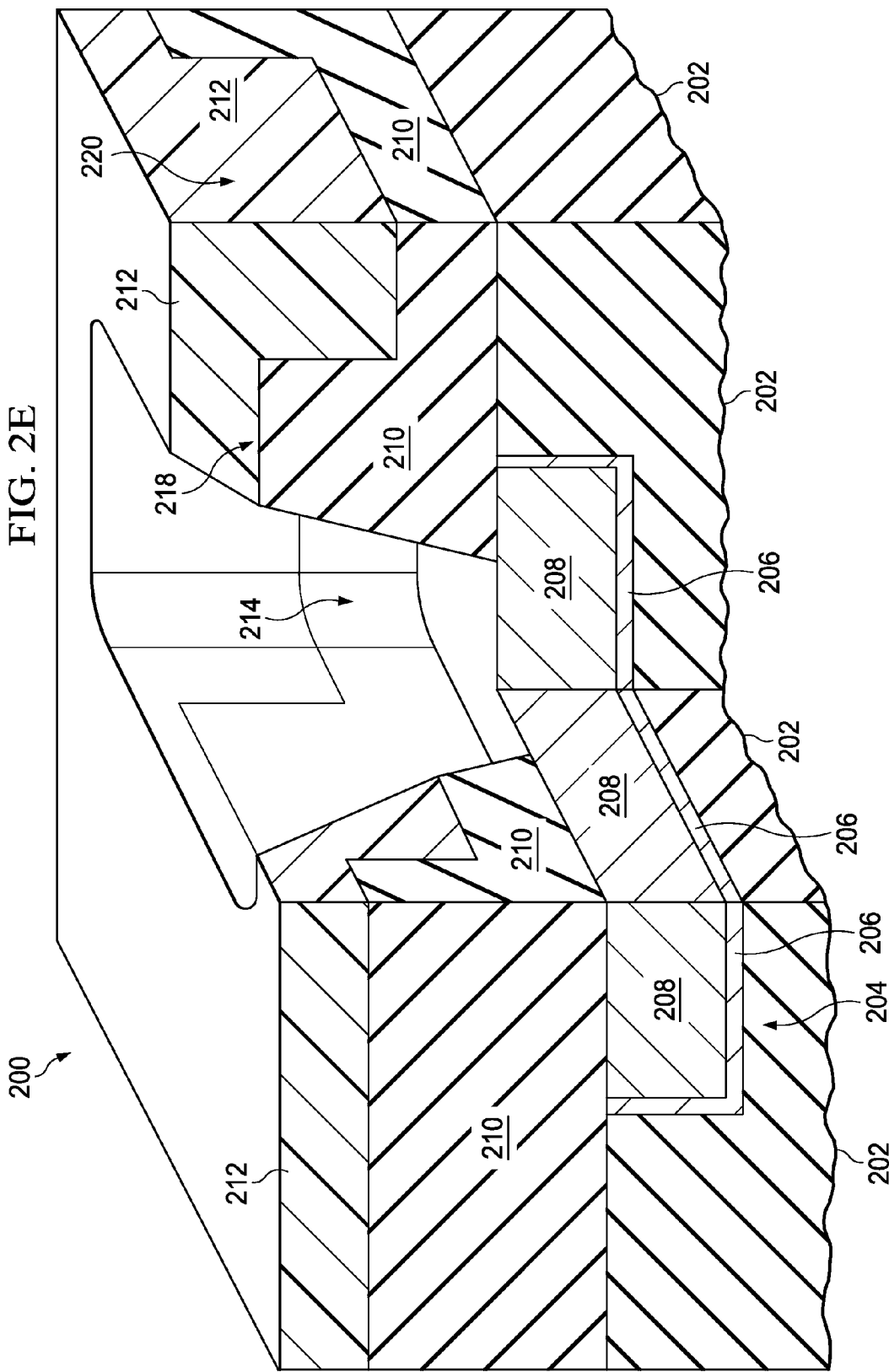

USE OF DIELECTRIC SLOTS FOR REDUCING VIA RESISTANCE IN DUAL DAMASCENE PROCESS

CROSS-REFERENCE TO RELATED APPLICATIONS

This application is a continuation of U.S. Nonprovisional patent application Ser. No. 14/501,338, filed Sep. 30, 2014, which claims the benefit of U.S. Provisional Patent application Ser. No. 61/916,840, filed Dec. 17, 2013, the contents of which are herein incorporated by reference in its entirety.

FIELD OF THE INVENTION

This invention relates to the field of integrated circuits. More particularly, this invention relates to metal interconnects in integrated circuits.

BACKGROUND OF THE INVENTION

An integrated circuit contains vias formed using a dual damascene process. Some of the vias are formed in interconnect lines which are significantly wider than minimum width interconnect lines at the same level. Dual damascene vias in wide interconnect lines have flared profiles in which the tops of the vias are significantly wider than the bottoms of the vias. Flaring leads to more liner metal in the bottom of the vias, disadvantageously causing higher and/or erratic via resistance.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit and a method of manufacturing the integrated circuit may include dual damascene interconnects. A trench mask for an interconnect line which is at least twice as wide as a dual damascene via in the interconnect line may have a dielectric slot adjacent to the dual damascene via. The dual damascene via is laterally separated from the dielectric slot by no more than half a width of the dual damascene via.

DESCRIPTION OF THE VIEWS OF THE DRAWING

FIG. 1A through FIG. 1J are cross sections of an example integrated circuit containing dielectric slots adjacent to a dual damascene via, formed with a via-first dual damascene process, depicted in successive stages of fabrication.

FIG. 2A through FIG. 2G are cross sections of an example integrated circuit containing dielectric slots adjacent to a dual damascene via, formed with a trench-first dual damascene process, depicted in successive stages of fabrication.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit may include dual damascene interconnects formed using a via-first dual damascene process or a trench-first dual damascene process. The via-first process may be a partial-via-first process or a full-via-first process. A trench mask for a wide interconnect line which is at least twice as wide as a dual damascene via in the wide interconnect line may have a dielectric slot adjacent to the dual damascene via. The dual damascene via is laterally separated from the dielectric slot by no more than half a width of the dual damascene via. The wide interconnect line may include more than one dielectric slot adjacent to the dual damascene via. The wide interconnect line may include more than one dual damascene via adjacent to the dielectric slot.

Figure 1A:
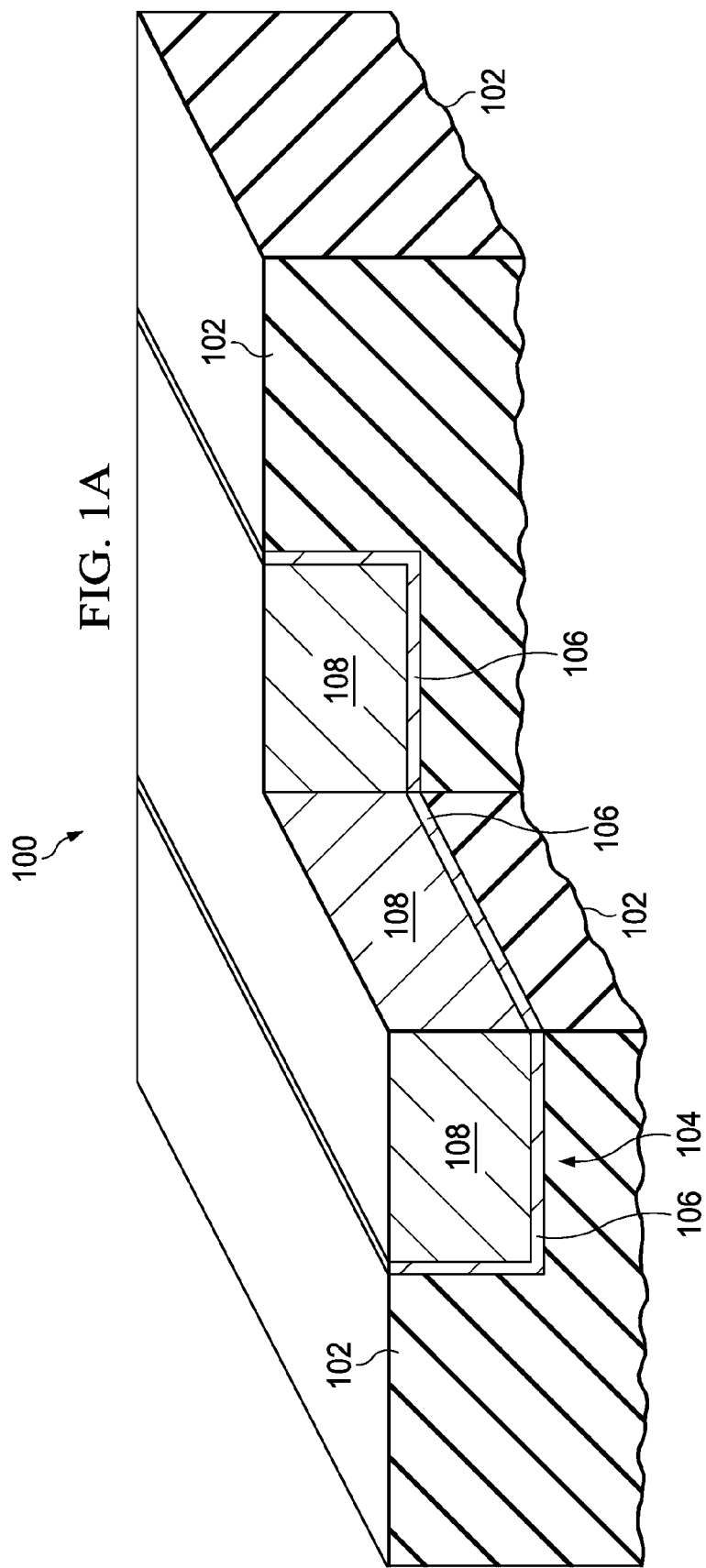

FIG. 1A through FIG. 1J are cross sections of an example integrated circuit containing dielectric slots adjacent to a dual damascene via, formed with a via-first dual damascene process, depicted in successive stages of fabrication. Referring to FIG. 1A, the integrated circuit 100 includes a lower dielectric layer 102, which may be, for example, a pre-metal dielectric (PMD) layer, an intra-metal dielectric (IMD) layer or an inter-level dielectric (ILD) layer. The lower dielectric layer 102 may include, for example, silicon dioxide based dielectric material such as organo-silicate glass (OSG), carbon-doped silicon oxides (SiCO or CDO) or porous OSG (p-OSG). The lower dielectric layer 102 may be formed, for example, using a plasma enhanced chemical vapor deposition (PECVD) process, a sub-atmospheric chemical vapor deposition (SACVD) process, or other process appropriate for forming the lower dielectric layer 102. The lower dielectric layer 102 may also include a cap layer and/or an etch stop layer, which are not shown so as to more clearly illustrate key features of the instant example.

A lower metal interconnect 104 is formed in the integrated circuit 100, disposed in the lower dielectric layer 102. The lower metal interconnect 104 may have a damascene metal liner 106 and a damascene fill metal 108 as depicted in FIG. 1A and be formed with a damascene process in the lower dielectric layer 102. Alternatively, the lower metal interconnect 104 may be formed by etching a layer of interconnect metal and subsequently forming the lower dielectric layer 102 around the lower metal interconnect 104. The lower metal interconnect 104 is depicted in FIG. 1A as an interconnect line, but may be an interconnect pillar or a contact to a substrate of the integrated circuit 100.

Figure 1B:
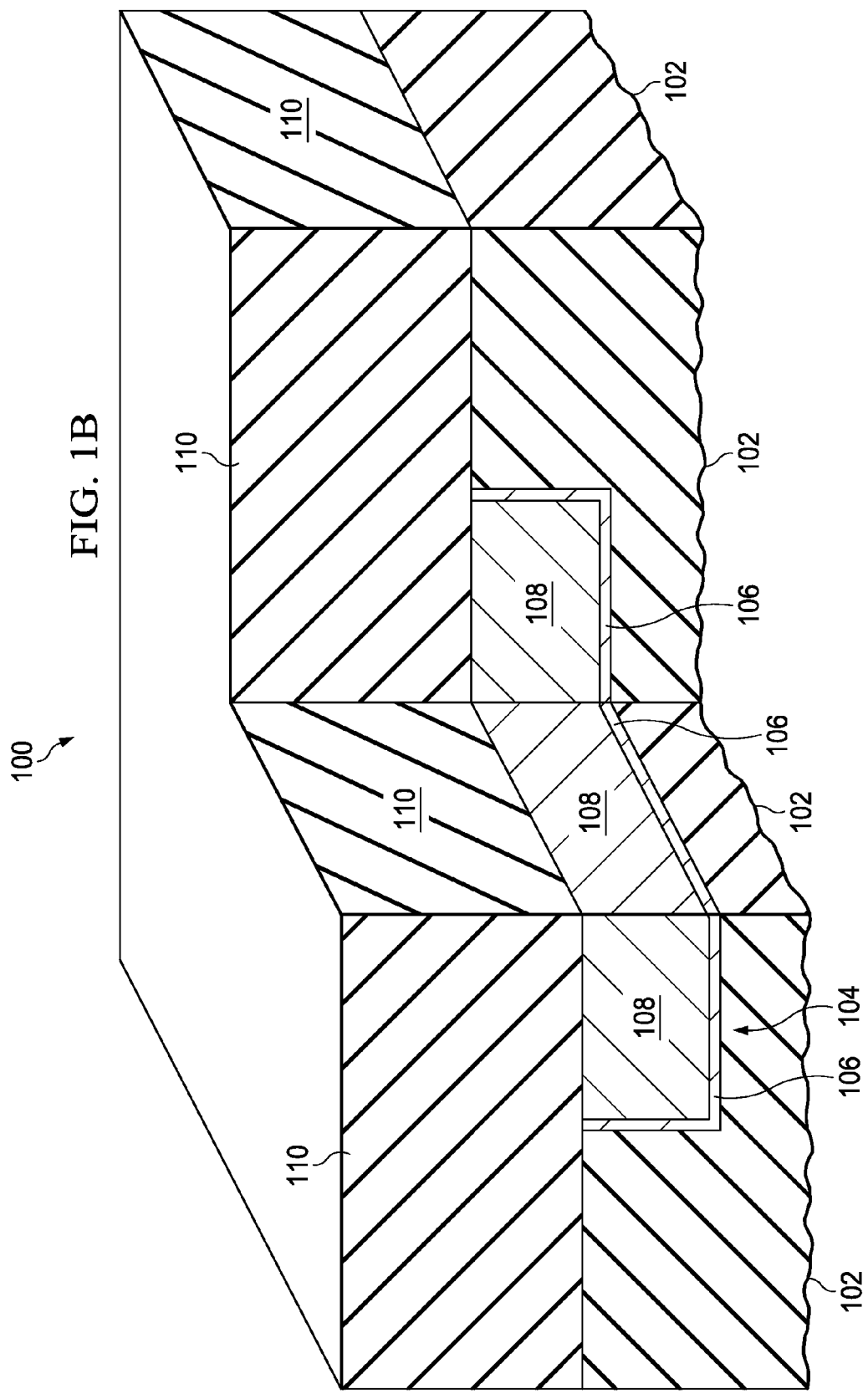

Referring to FIG. 1B, an ILD layer 110 is formed over the lower dielectric layer 102 and the lower metal interconnect 104. The ILD layer 110 may include, for example, silicon dioxide based dielectric material such as OSG, CDO or p-OSG. The ILD layer 110 may also include a cap layer and/or an etch stop layer, which are not shown so as to more clearly illustrate key features of the instant example.

Figure 1C:
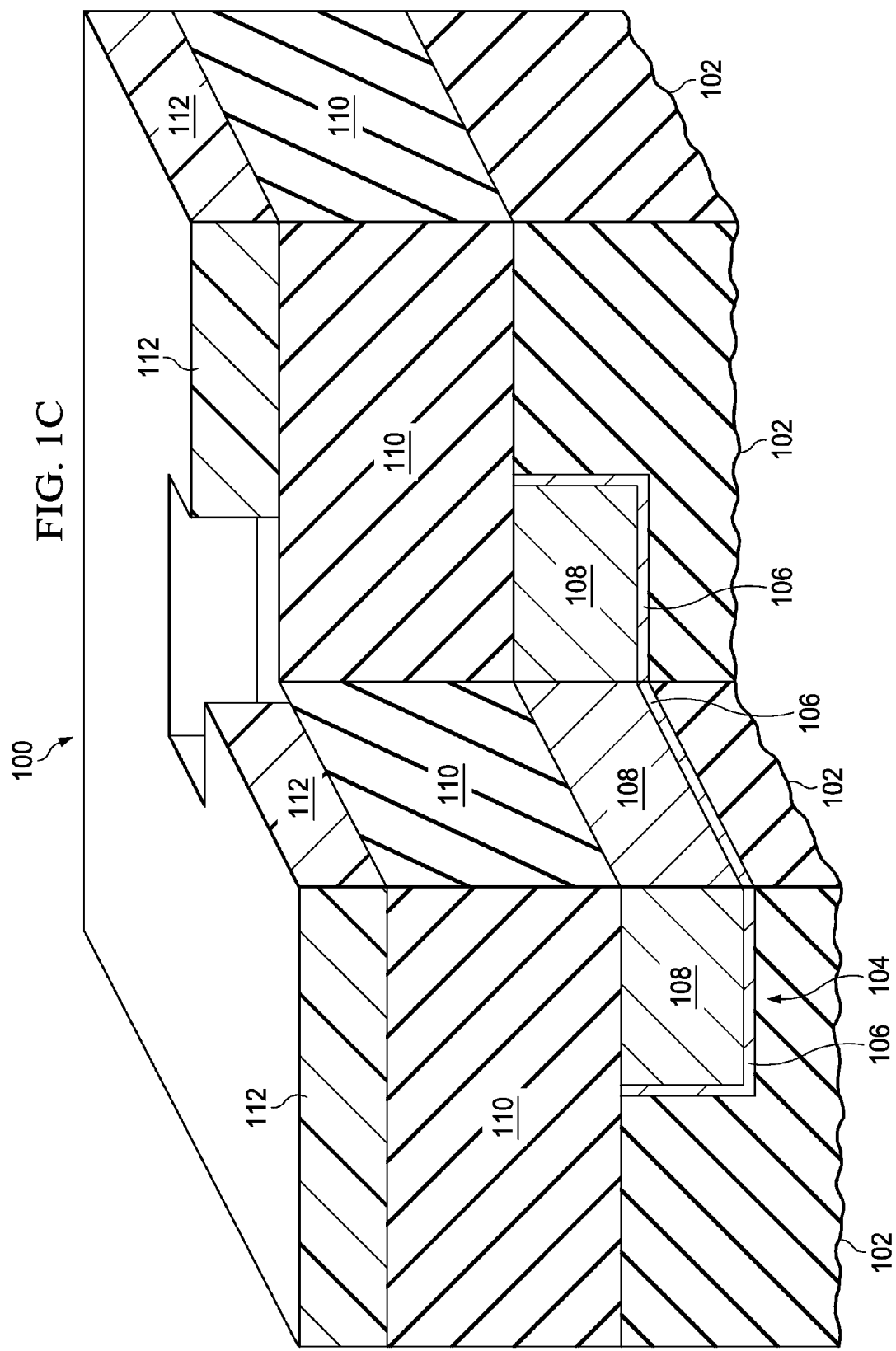

Referring to FIG. 1C, a via etch mask 112 is formed over the ILD layer 110 so as to expose an area for a dual damascene via over the lower metal interconnect 104. The via etch mask 112 may include photoresist formed by a photolithographic process. Alternatively, the via etch mask 112 may include hard mask material such as silicon nitride, silicon carbide, amorphous carbon, and such, formed by a selective reactive ion etch (RIE) process through a photoresist mask.

Referring to FIG. 1D, a via etch process removes material from the ILD layer 110 in the area exposed by the via etch mask 112 to form a via hole 114 in the ILD layer 110. In one version of the instant example, using a partial-via-first dual damascene process, the via hole 114 may extend partway to the lower metal interconnect 104 as depicted in FIG. 1D. In an alternate version, using a full-via-first dual damascene process, the via hole 114 may extend to an etch stop layer over the lower metal interconnect 104 or may extend substantially to the lower metal interconnect 104. The via etch process may include one or more RIE steps as appropriate for cap layers, silicon dioxide based dielectric material and/or etch stop layers. The via etch process may be a timed etch or may be endpointed.

Figure 1E:
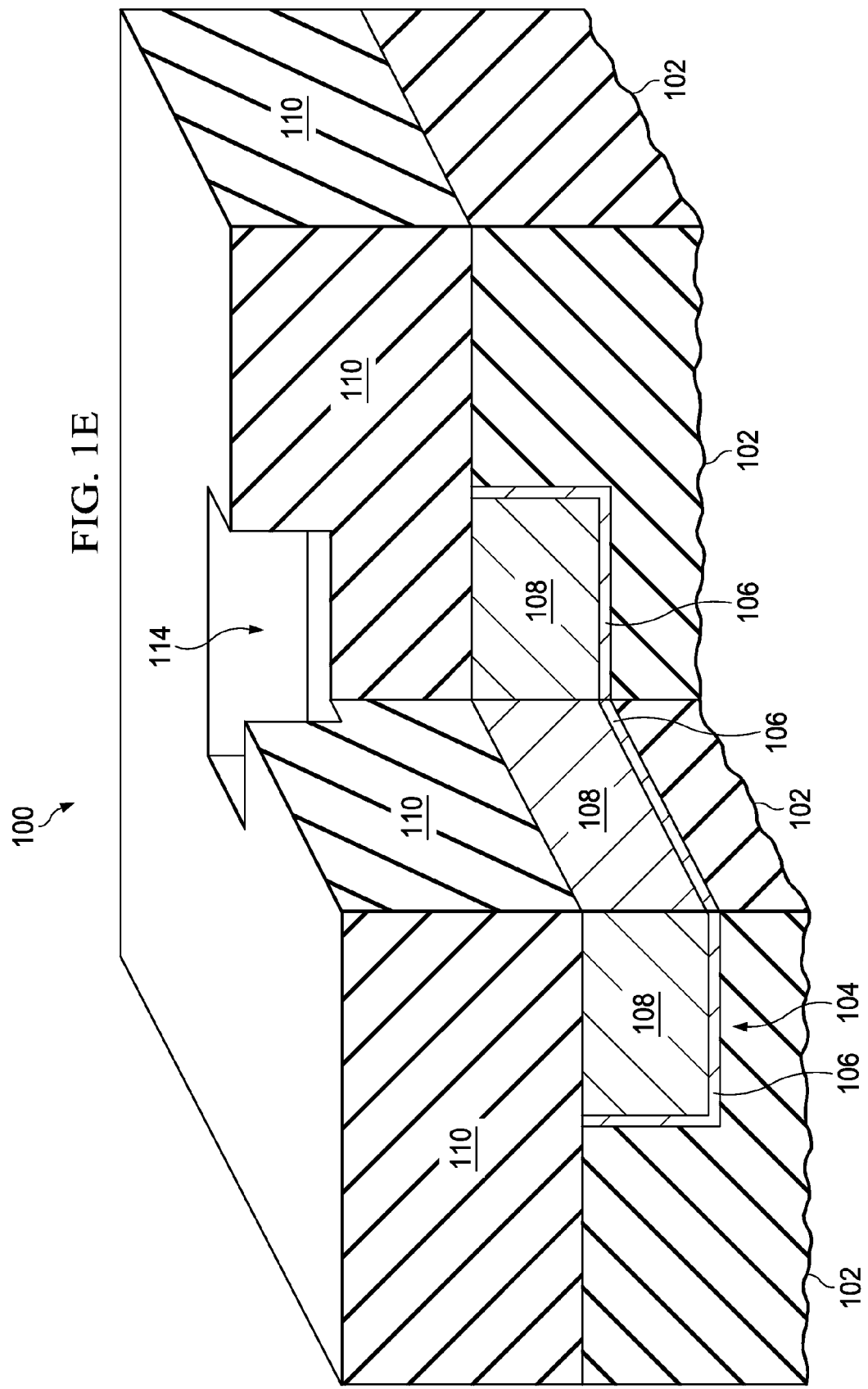

Referring to FIG. 1E, a remaining portion of the via etch mask 112 of FIG. 1D is removed after the via etch process is completed. The via etch mask 112 may be removed, for example, by a plasma etch process using oxygen radicals, such as an ash process.

Figure 1F:
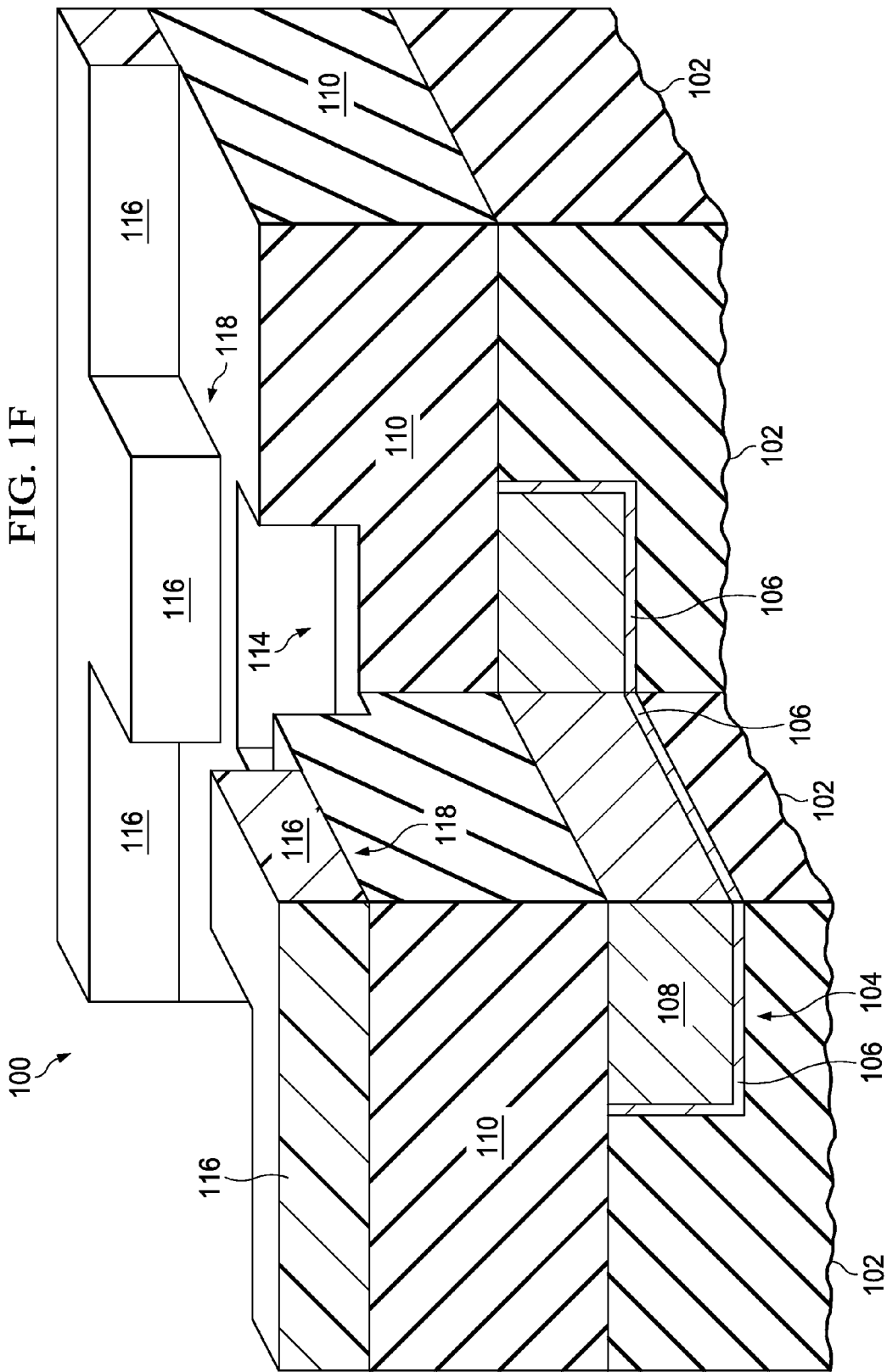

Referring to FIG. 1F, a trench etch mask 116 is formed over the ILD layer 110 so as to expose an area for a dual damascene trench which includes the via hole 114. The trench etch mask 116 may include photoresist or may include hard mask material, as described in reference to the via etch mask 112 of FIG. 1C. In the instant example, the trench etch mask 116 covers areas for dielectric slots 118 adjacent to the via hole 114. In the instant example, the areas for the dielectric slots 118 extend to edges of the area exposed for the dual damascene trench.

Figure 1G:
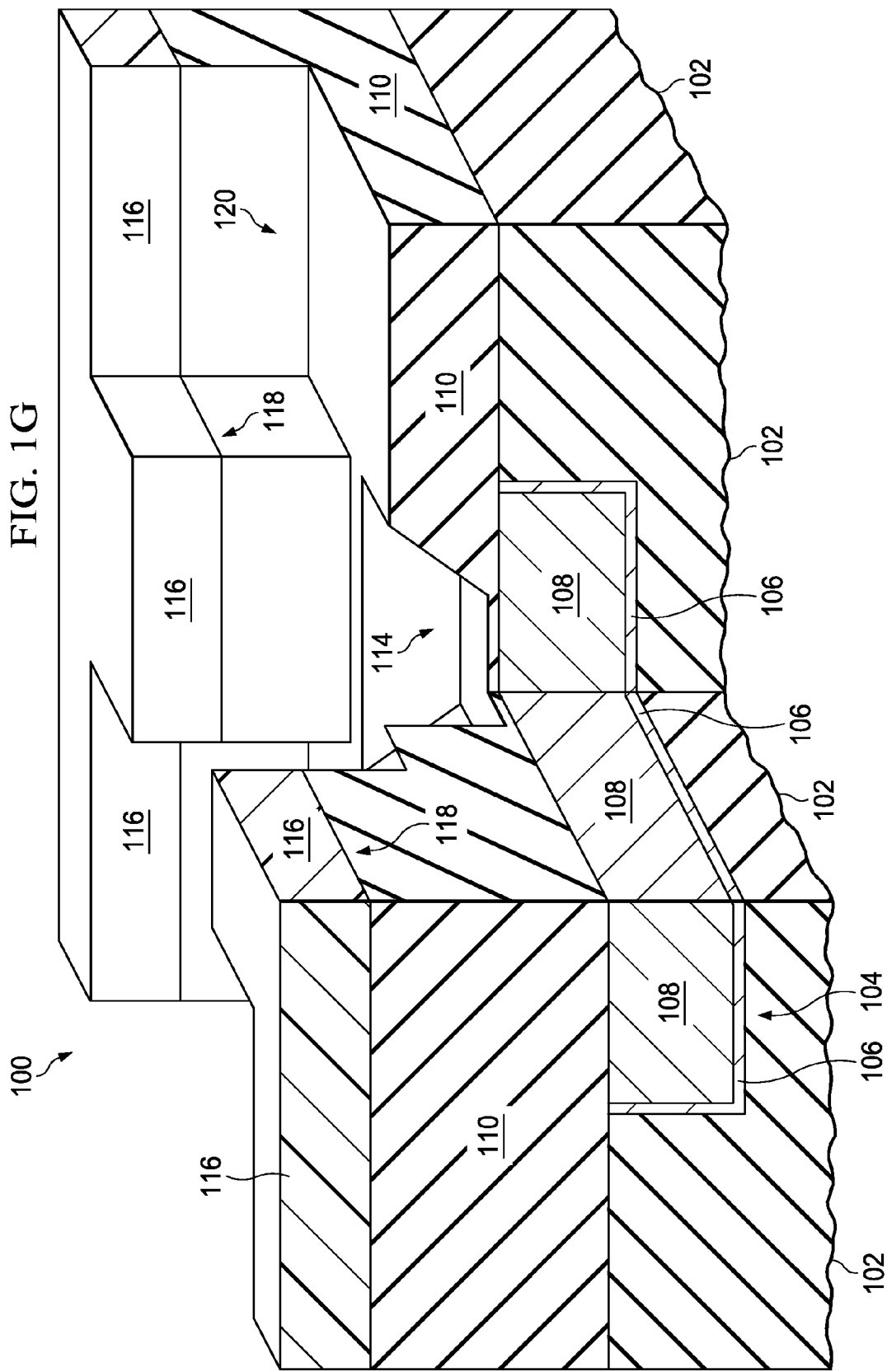

Referring to FIG. 1G, a trench etch process removes material from the ILD layer 110 in the area exposed by the trench etch mask 116 to form a dual damascene trench 120 in the ILD layer 110. The trench etch process concurrently deepens the via hole 114 if any dielectric material remains in the ILD layer 110 under the via hole 114. The trench etch process may include one or more RIE steps as appropriate for cap layers, silicon dioxide based dielectric material and/or etch stop layers. The trench etch process may be a timed etch or may be endpointed. Dielectric material of the ILD layer 110 in the areas of the dielectric slots 118 is not removed by the trench etch process. During the trench etch process, the via hole 114 may become flared, that is, may have a shallow slope, on sides which are not adjacent to the dielectric slots 118, compared to sides of the via hole 114 which are adjacent to the dielectric slots 118. Flaring of the via hole 114 may result, for example, from access to the via hole 114 by reactive species in the trench etch process; such access is blocked by the trench etch mask 116 over the dielectric slots 118.

Figure 1H:
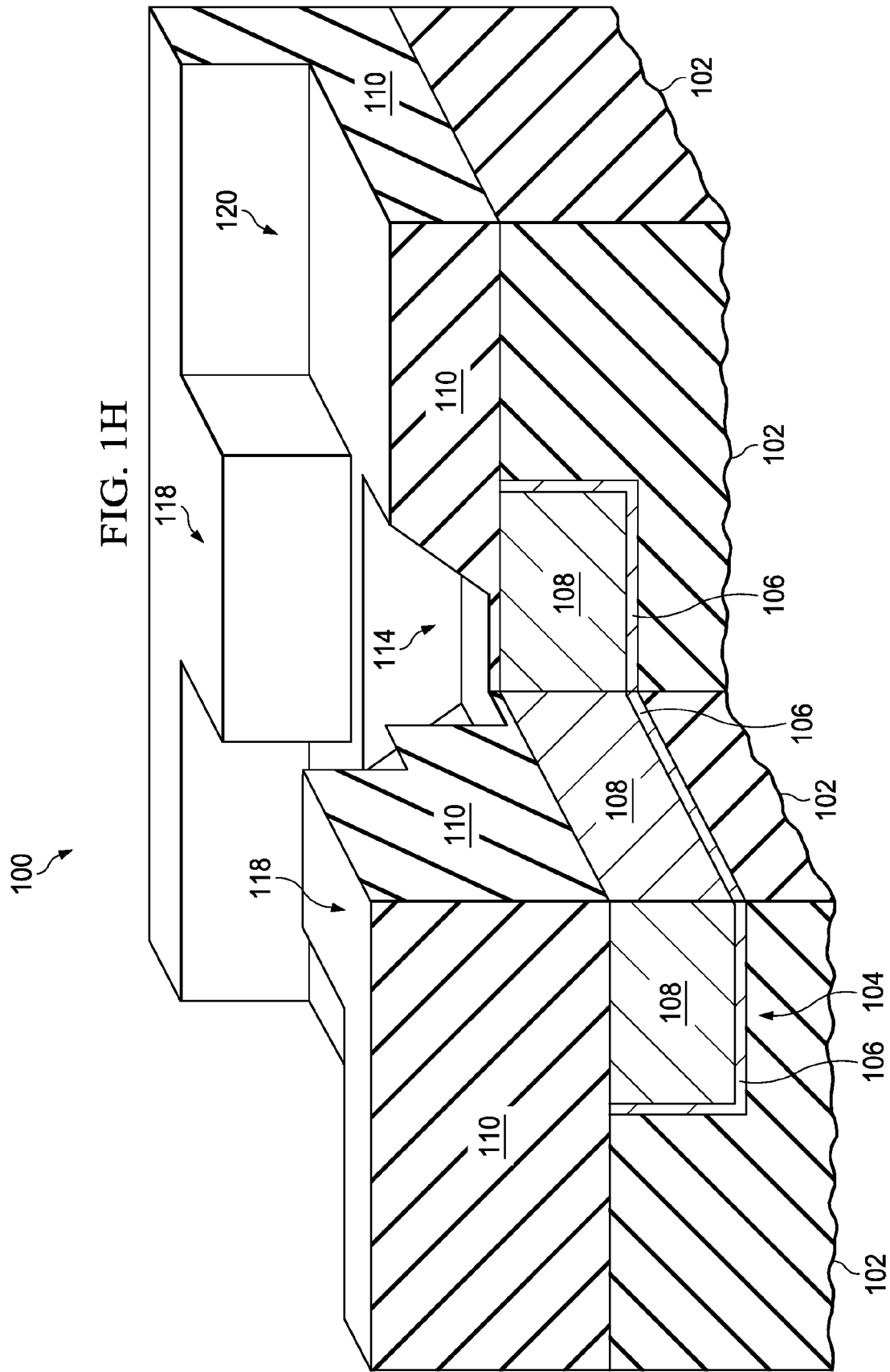

Referring to FIG. 1H, the trench etch mask 116 is removed after the trench etch process is completed. The trench etch mask 116 may be removed, for example, by a plasma etch process using oxygen radicals, such as an ash process. The trench etch mask 116 may possibly be removed prior to etching through an etch stop layer or cap layer over the lower metal interconnect 104.

Figure 1I:
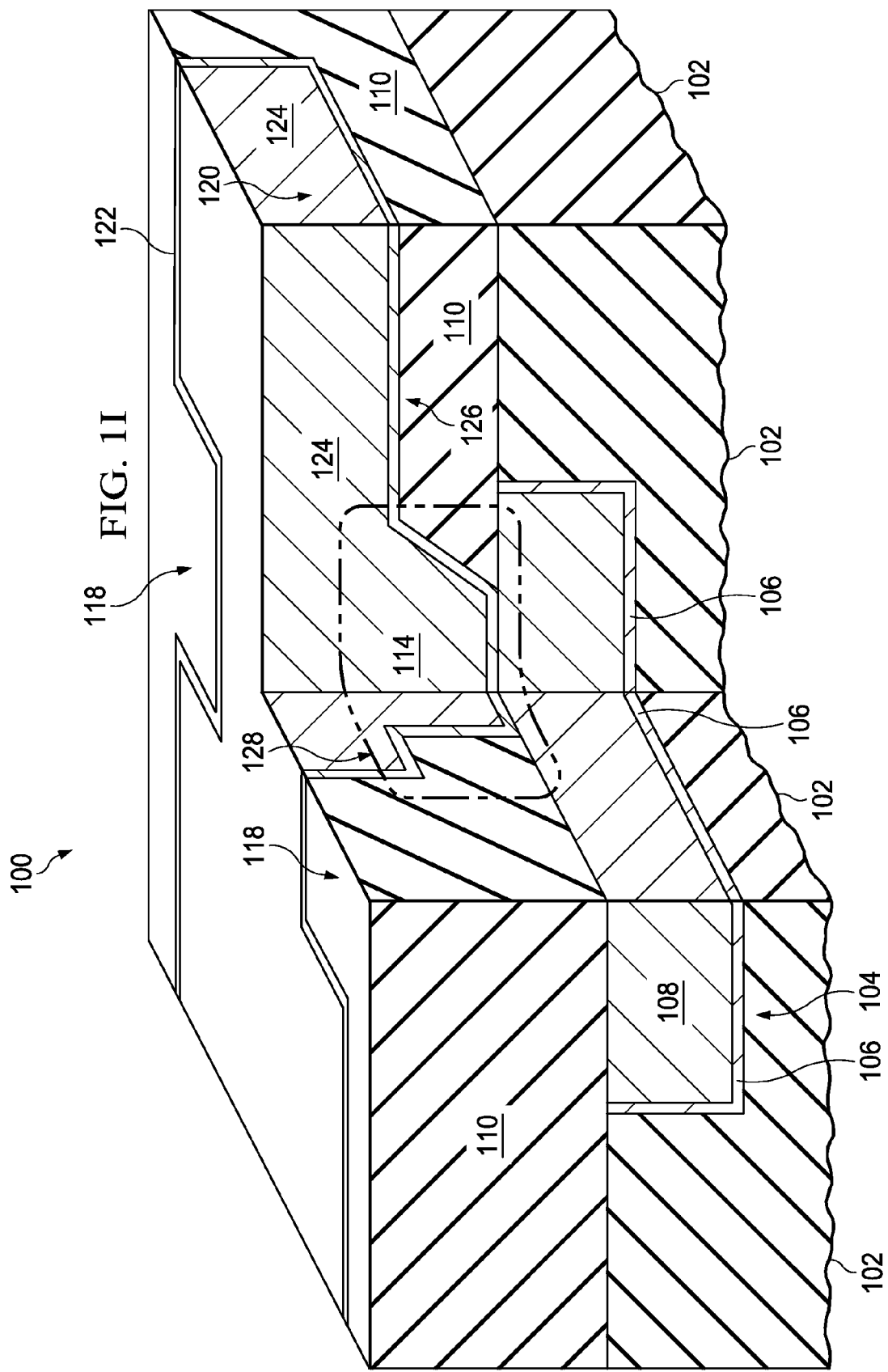

Referring to FIG. 1I, a dual damascene liner 122 is formed in the dual damascene trench 120 and via hole 114. The dual damascene liner 122 may include, for example, a layer of tantalum nitride, tantalum, titanium or titanium nitride, followed by a layer of sputtered copper. The dual damascene liner 122 extends onto the lower metal interconnect 104. A thickness of the dual damascene liner 122 on the lower metal interconnect 104 may be determined by a total amount of flaring of the via hole 114. Forming the dielectric slots 118 adjacent to the via hole 114 may reduce the total amount of flaring of the via hole 114 which may in turn advantageously reduce the thickness of the dual damascene liner 122 on a top surface of the lower metal interconnect 104 inside the via hole 114.

A dual damascene fill metal 124 is formed on the dual damascene liner 122. The dual damascene fill metal 124 may be, for example, electroplated copper. The dual damascene fill metal 124 and the dual damascene liner 122 are removed from a top surface of the ILD layer 110, for example, using a chemical mechanical polish (CMP) process, to form a dual damascene upper metal interconnect 126 and a dual damascene via 128, both of which include the dual damascene fill metal 124 and the dual damascene liner 122. The dual damascene via 128 provides an electrical connection between the dual damascene upper metal interconnect 126 and the lower metal interconnect 104. An electrical resistance from the dual damascene upper metal interconnect 126 through the dual damascene via 128 to the lower metal interconnect 104 may advantageously be reduced by the lower thickness of the dual damascene liner 122 on the lower metal interconnect 104, resulting from the dielectric slots 118 adjacent to the via hole 114. Lateral dimensions of the dielectric slots 118 may be selected so that electrical resistance of the dual damascene upper metal interconnect 126 meets a desired value.

Figure 1J:
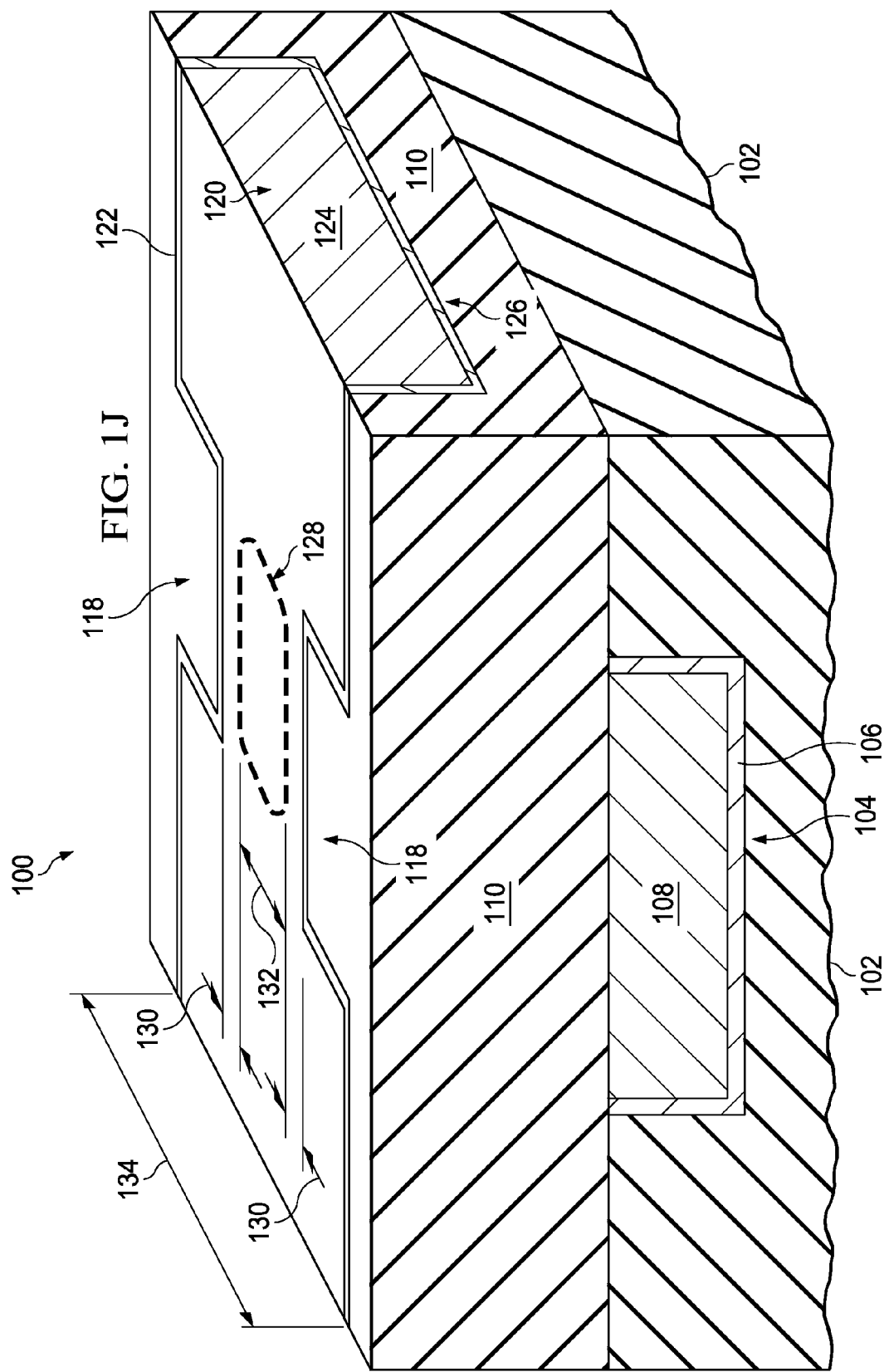

FIG. 1J is another view of the integrated circuit 100 at the same fabrication stage as depicted in FIG. 1I, showing a more complete view of the dielectric slots 118. A lateral position of the dual damascene via 128 is indicated by a dashed loop to show its lateral proximity to the dielectric slots 118. A lateral separation 130 between each dielectric slot 118 and the dual damascene via 128 is less than half a width 132 of the dual damascene via 128. In the instant example, a width 134 of the dual damascene upper metal interconnect 126 is at least twice the width 132 of the dual damascene via 128.

Figure 2A:
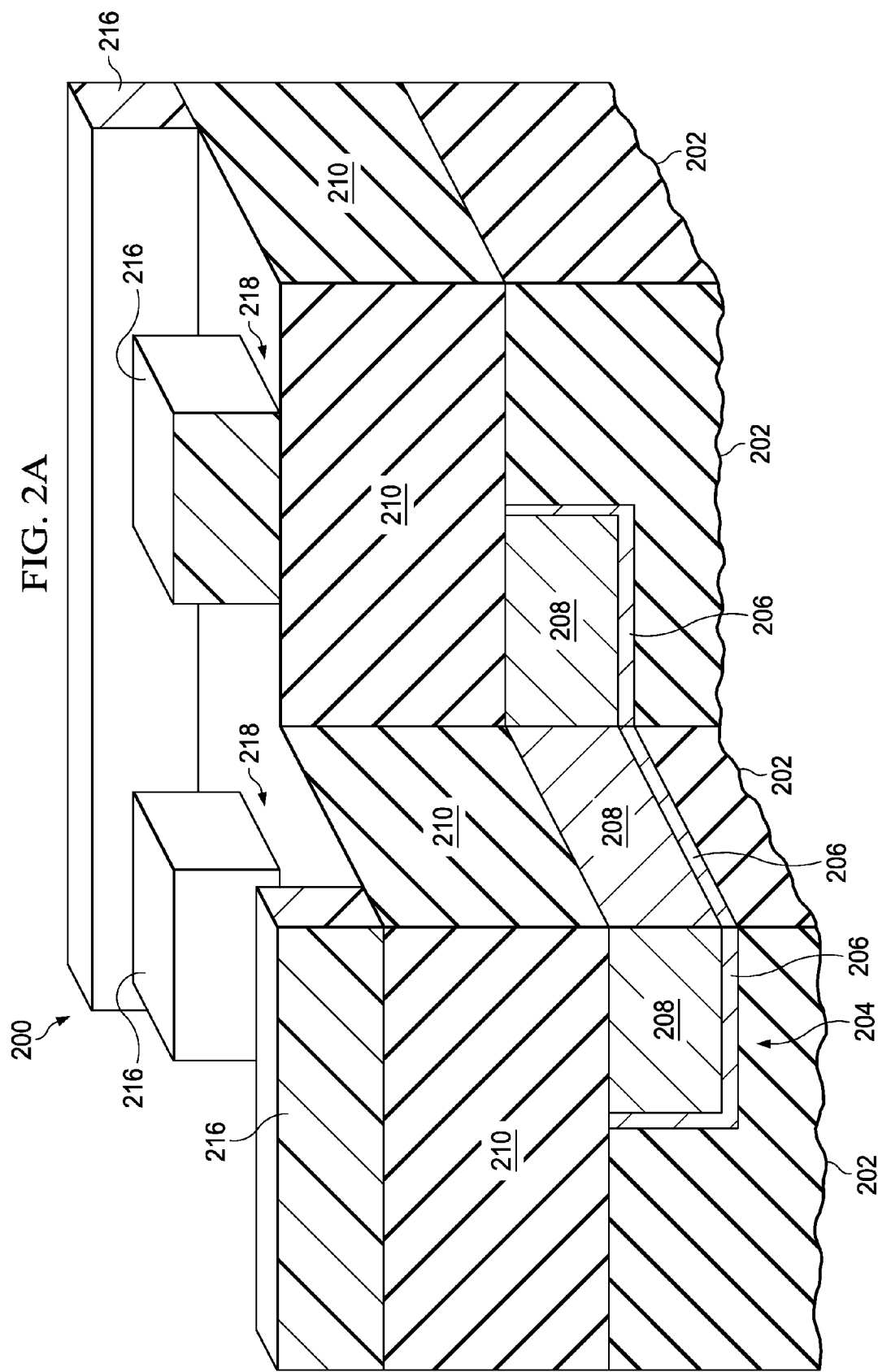

FIG. 2A through FIG. 2G are cross sections of an example integrated circuit containing dielectric slots adjacent to a dual damascene via, formed with a trench-first dual damascene process, depicted in successive stages of fabrication. Referring to FIG. 2A, the integrated circuit 200 includes a lower dielectric layer 202 as described in reference to FIG. 1A. A lower metal interconnect 204, possibly including a damascene metal liner 206 and a damascene fill metal 208 as depicted in FIG. 2A, is formed in the integrated circuit 200, disposed in the lower dielectric layer 202, for example, as described in reference to FIG. 1A. An ILD layer 210 is formed over the lower dielectric layer 202 and the lower metal interconnect 204.

A trench etch mask 216 is formed over the ILD layer 210 so as to expose an area for a dual damascene trench. The trench etch mask 216 may include photoresist or may include hard mask material, as described in reference to the via etch mask 112 of FIG. 1C. In the instant example, the trench etch mask 216 covers areas for dielectric slots 218 adjacent to a subsequently formed via hole. In the instant example, the areas for the dielectric slots 218 are surrounded by the area exposed for the dual damascene trench.

Figure 2B:
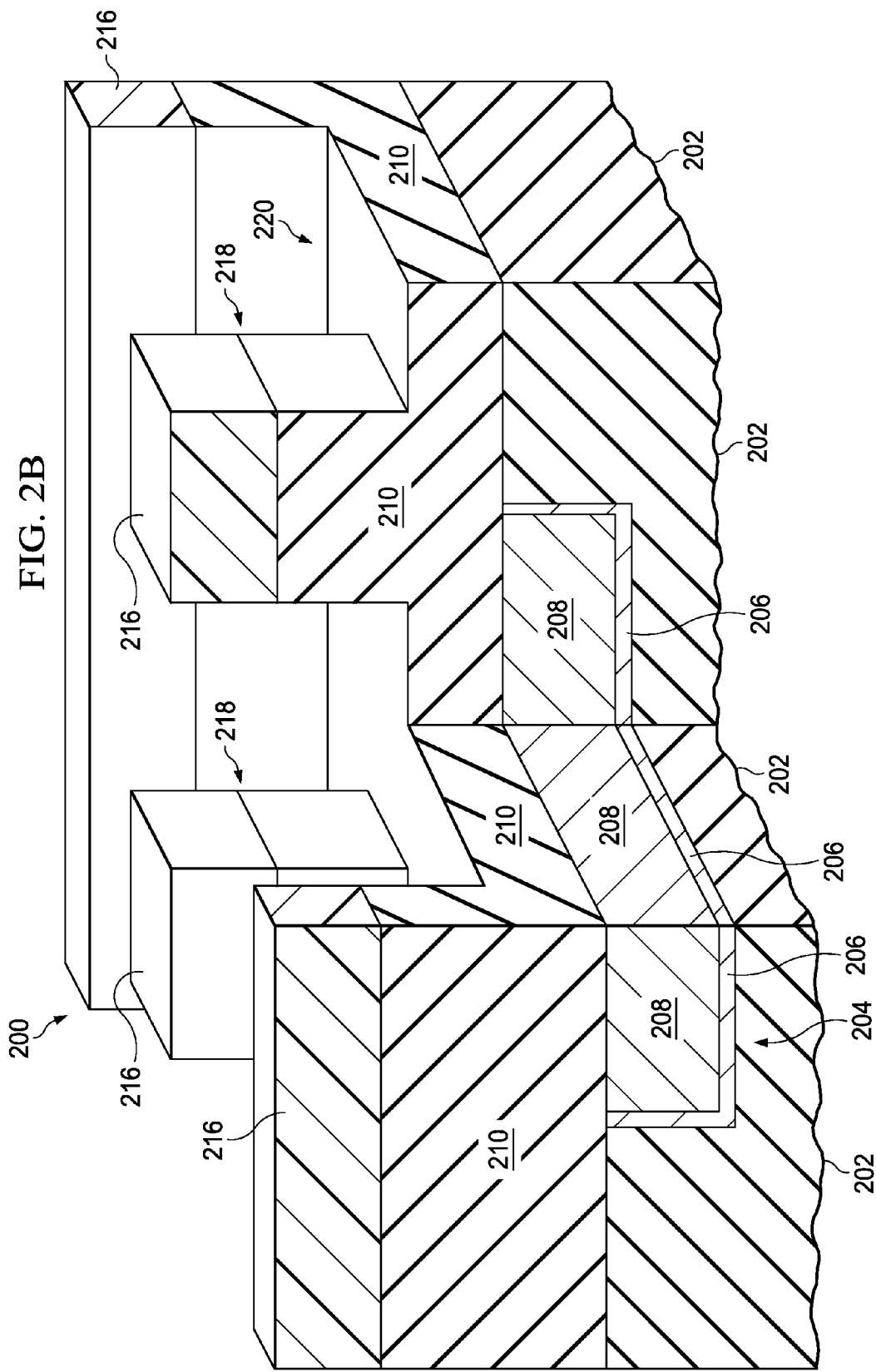

Referring to FIG. 2B, a trench etch process removes material from the ILD layer 210 in the area exposed by the trench etch mask 216 to form a dual damascene trench 220. The trench etch process may include one or more RIE steps as appropriate for cap layers, silicon dioxide based dielectric material and/or etch stop layers. The trench etch process may be a timed etch or may be endpointed. Dielectric material of the ILD layer 210 in the areas of the dielectric slots 218 is not removed by the trench etch process.

Figure 2C:
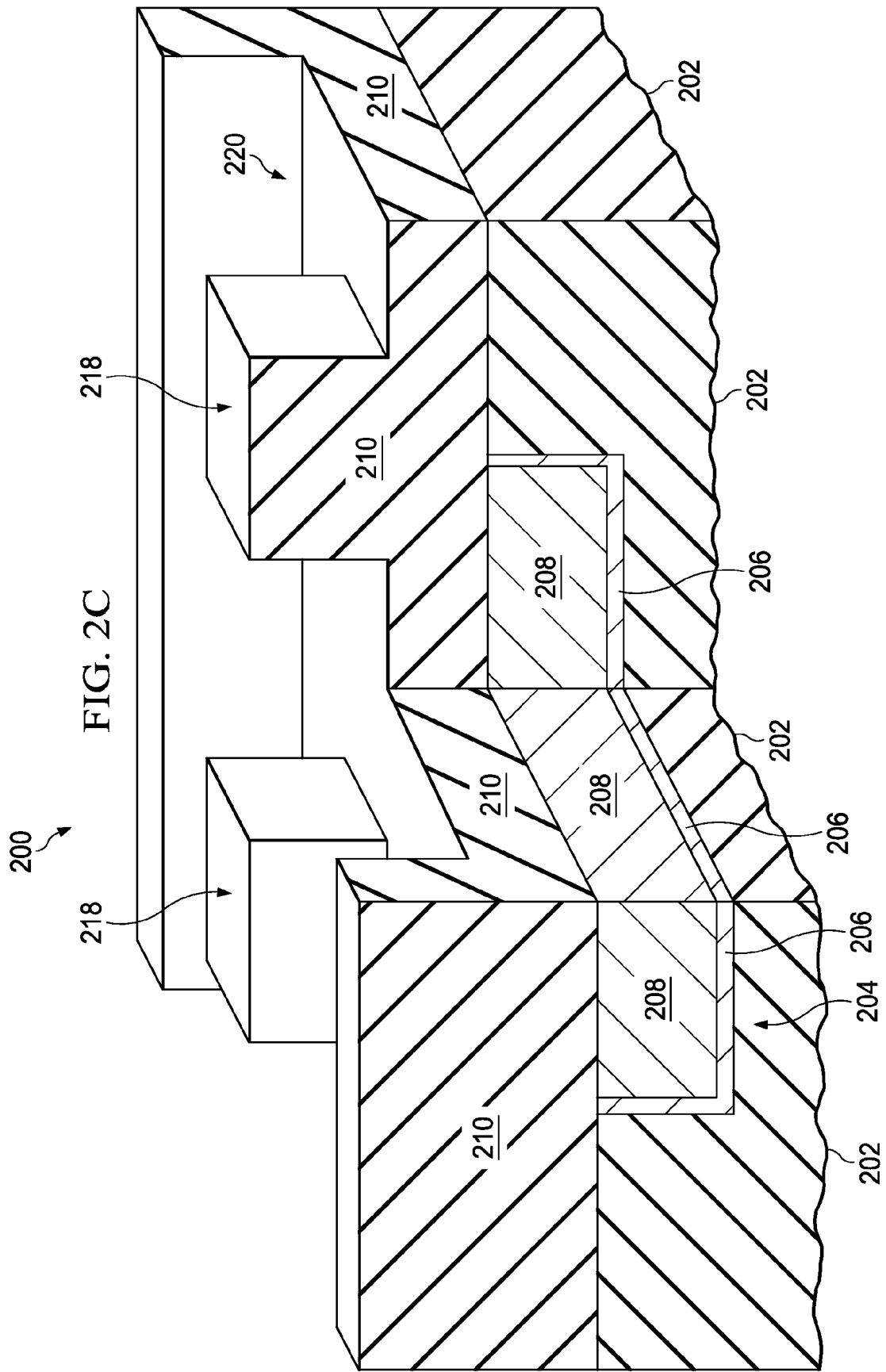

Referring to FIG. 2C, the trench etch mask 216 is removed after the trench etch process is completed. The trench etch mask 216 may be removed, for example, similarly to removal of the trench etch mask 116 as described with respect to FIG. 1H.

Figure 2D:
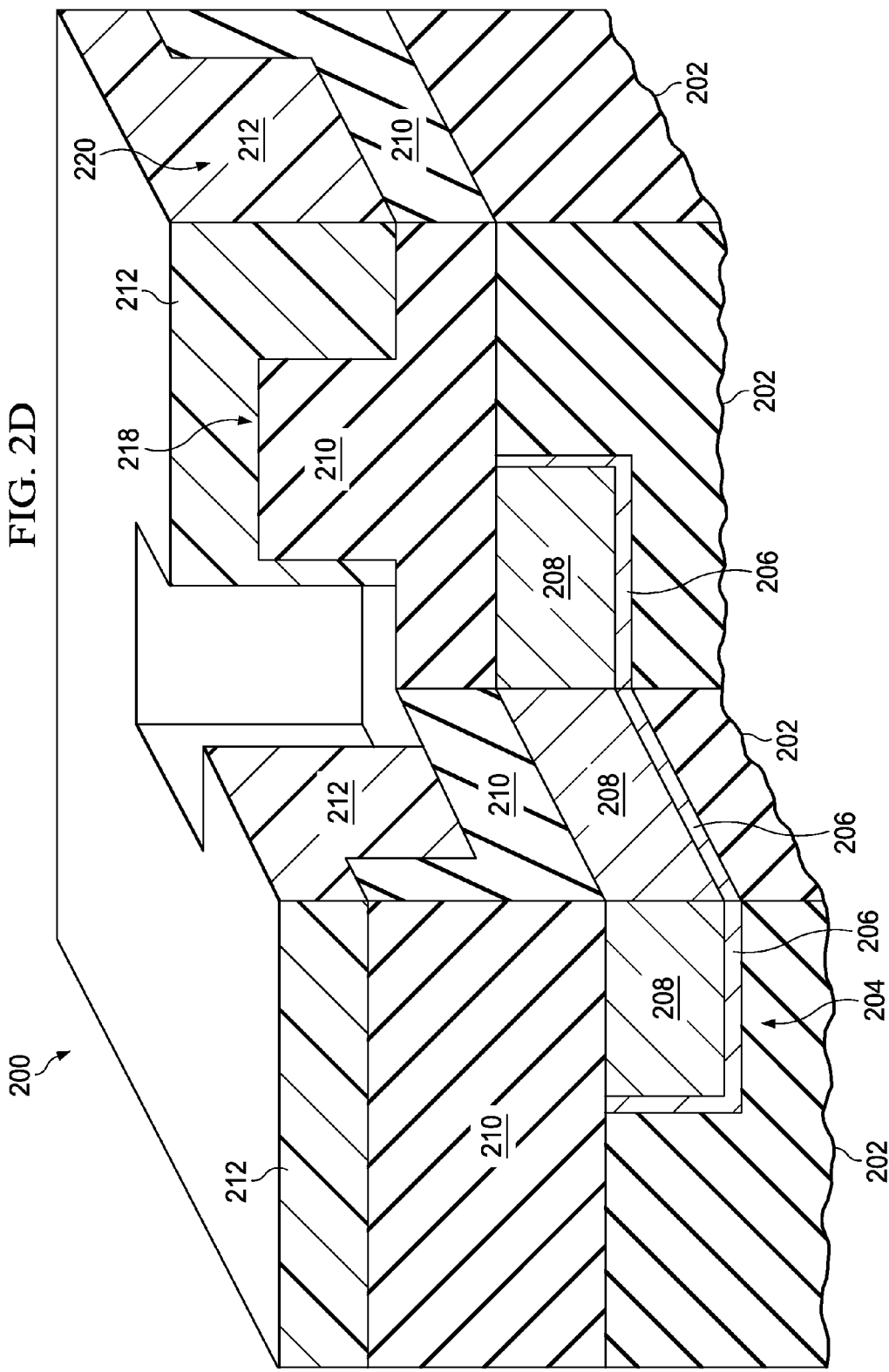

Referring to FIG. 2D, a via etch mask 212 is formed over the ILD layer 210 and in the dual damascene trench 220 so as to expose an area for a dual damascene via over the lower metal interconnect 204. The area exposed for the dual damascene via is at a bottom surface of the dual damascene trench 220 between the dielectric slots 218.

Referring to FIG. 2E, a via etch process removes material from the ILD layer 210 in the area exposed by the via etch mask 212 to form a via hole 214. The via hole 214 may extend to an etch stop layer over the lower metal interconnect 204 or may extend substantially to the lower metal interconnect 204. The via etch process may include one or more RIE steps as appropriate for cap layers, silicon dioxide based dielectric material and/or etch stop layers. During the via etch process, the via hole 214 may become flared on sides which are not adjacent to the dielectric slots 218, compared to sides of the via hole 214 which are adjacent to the dielectric slots 218, as explained in reference to FIG. 1G. The via etch mask 212 is removed after the via etch process is completed, for example as described in reference to FIG. 1E. The via etch mask 212 may possibly be removed prior to etching through an etch stop layer or cap layer over the lower metal interconnect 204.

Figure 2F:
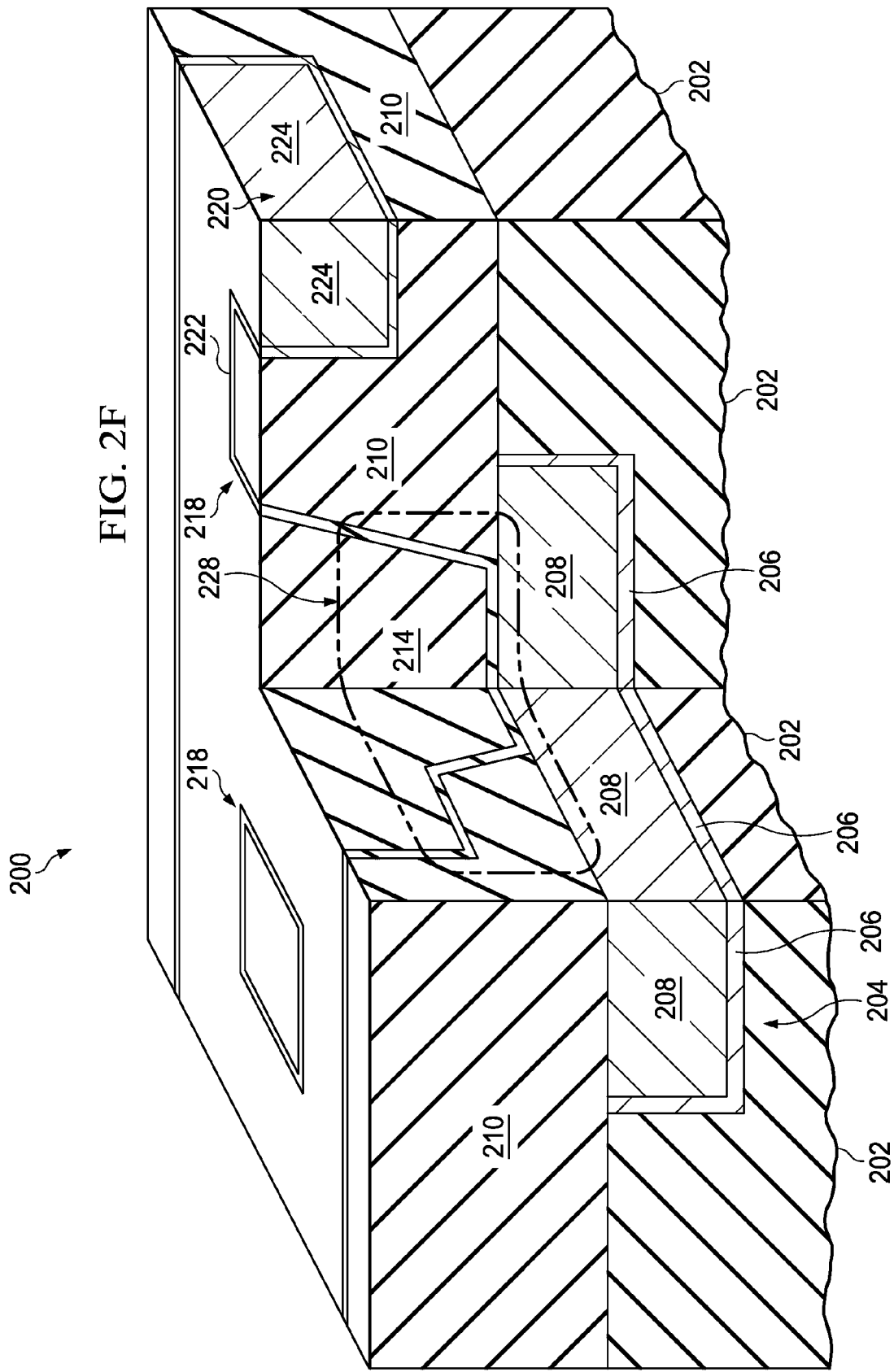

Referring to FIG. 2F, a dual damascene liner 222 is formed in the dual damascene trench 220 and via hole 214 as described in reference to FIG. 1I. The dual damascene liner 222 extends onto the lower metal interconnect 204 in the via hole 214. A thickness of the dual damascene liner 222 on the lower metal interconnect 204 may be determined by a total amount of flaring of the via hole 214. Forming the dielectric slots 218 adjacent to the via hole 214 may reduce the total amount of flaring of the via hole 214 which may in turn advantageously reduce the thickness of the dual damascene liner 222 on a top surface of the lower metal interconnect 204 in the via hole 214.

A dual damascene fill metal 224 is formed on the dual damascene liner 222 as described in reference to FIG. 1I. The dual damascene fill metal 224 and the dual damascene liner 222 is removed from a top surface of the ILD layer 210 to form a dual damascene upper metal interconnect 226 and a dual damascene via 228, both of which include the dual damascene fill metal 224 and the dual damascene liner 222. An electrical resistance from the dual damascene upper metal interconnect 226 through the dual damascene via 228 to the lower metal interconnect 204 may advantageously be reduced by the lower thickness of the dual damascene liner 222 on the lower metal interconnect 204, resulting from the dielectric slots 218 being formed adjacent to the via hole 214. Lateral dimensions of the dielectric slots 218 may be selected so that electrical resistance of the dual damascene upper metal interconnect 226 meets a desired value.

Figure 2G:
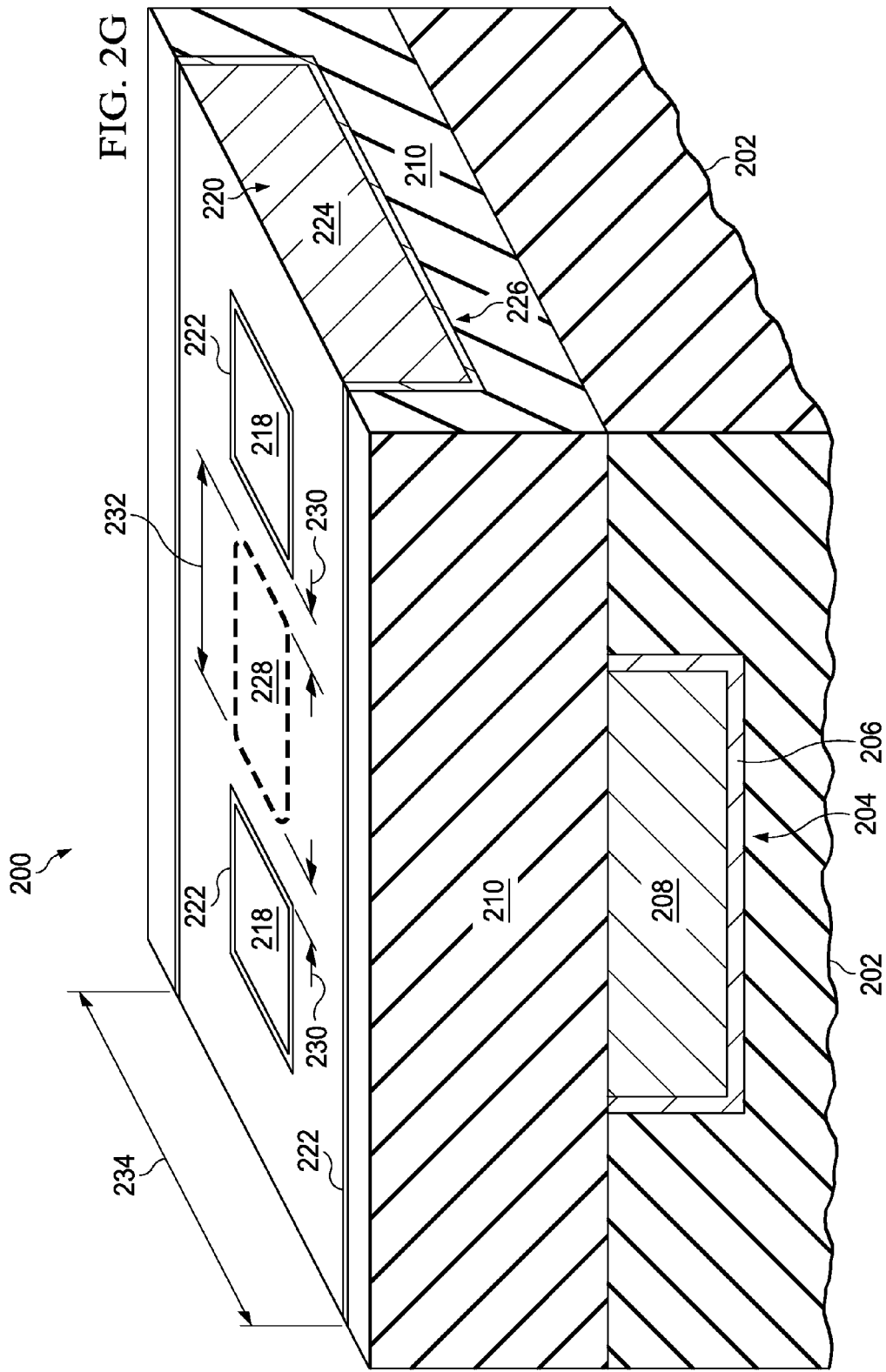

FIG. 2G is another view of the integrated circuit 200 at the same fabrication stage as depicted in FIG. 2F, showing a more complete view of the dielectric slots 218. A lateral position of the dual damascene via 228 is indicated by a dashed loop to show its lateral proximity to the dielectric slots 218. A lateral separation 230 between each dielectric slot 218 and the dual damascene via 228 is less than half a width 232 of the dual damascene via 228. In the instant example, a width 234 of the dual damascene upper metal interconnect 226 is at least twice the width 232 of the dual damascene via 228.

Figure 3A:
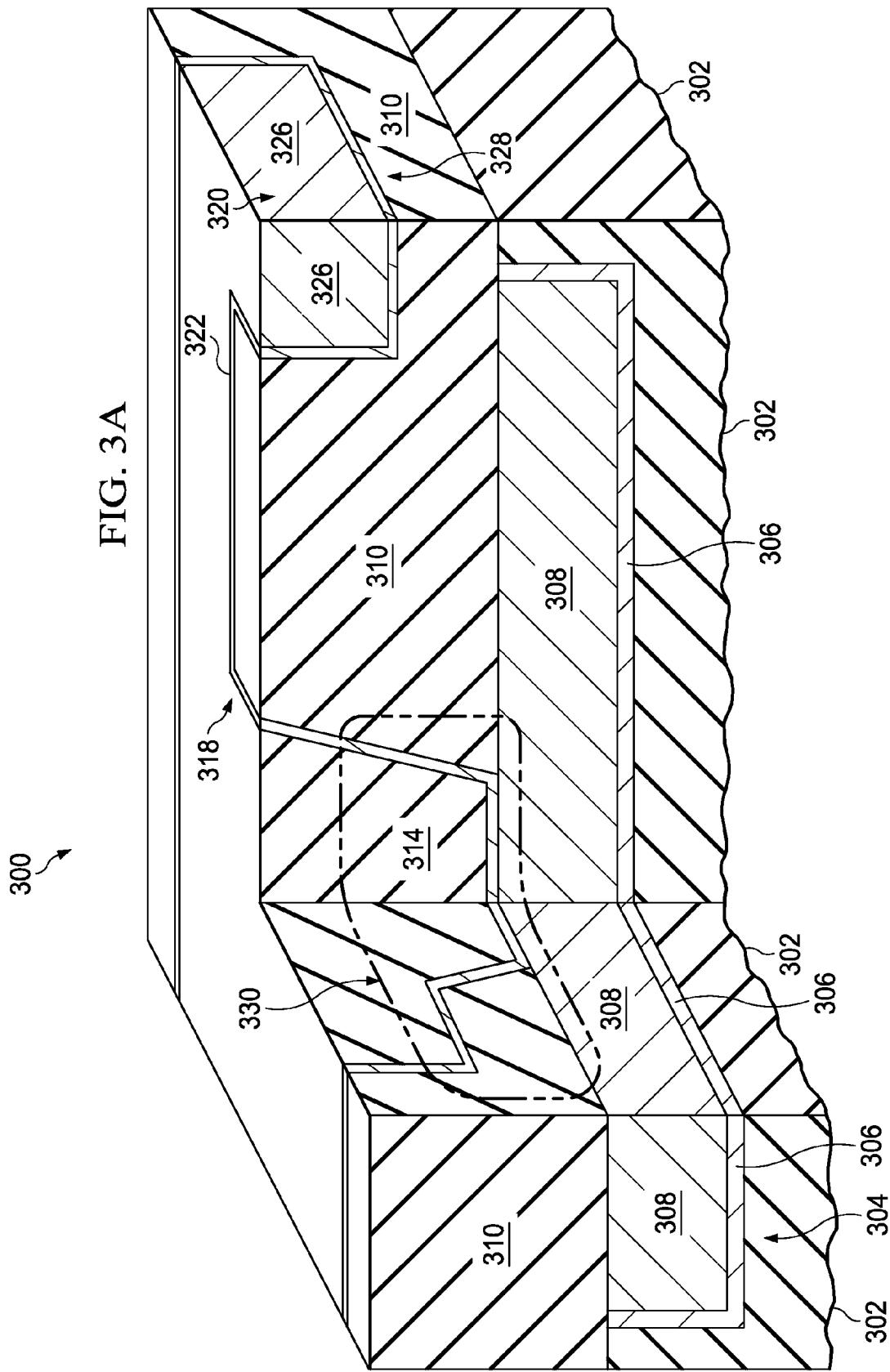
FIG. 3A and FIG. 3B are cross sections of an example integrated circuit containing a dielectric slot adjacent to a dual damascene via.
Figure 3B:
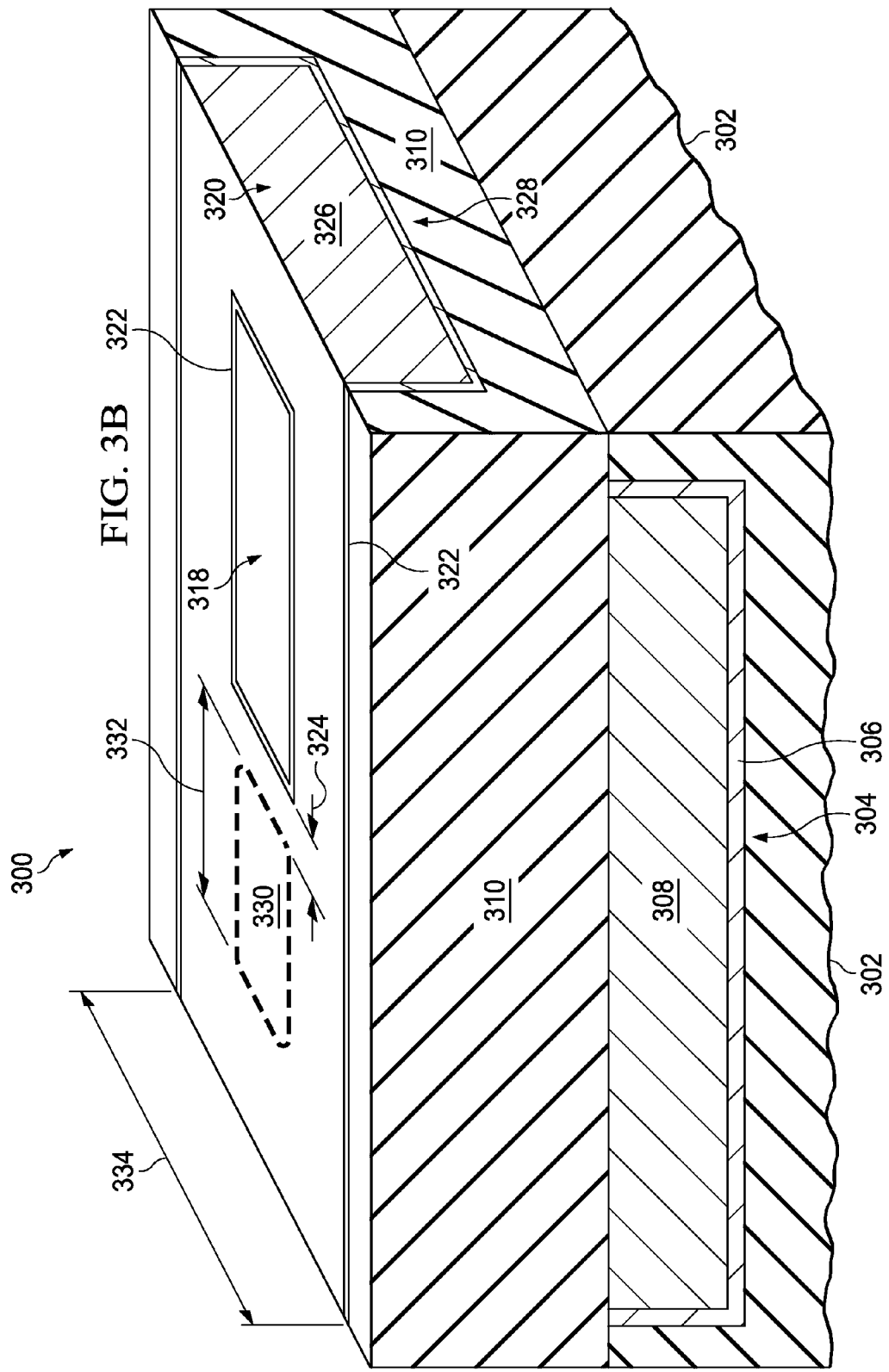

FIG. 3A and FIG. 3B are cross sections of an example integrated circuit containing a dielectric slot adjacent to a dual damascene via. Referring to FIG. 3A, the integrated circuit 300 includes a lower dielectric layer 302 and a lower metal interconnect 304, possibly including a damascene metal liner 306 and a damascene fill metal 308, disposed in the lower dielectric layer 302, as described in reference to FIG. 1A. An ILD layer 310 is formed over the lower dielectric layer 302 and the lower metal interconnect 304.

A dual damascene upper metal interconnect 326 and a dual damascene via 328, both of which include a dual damascene fill metal 324 and a dual damascene liner 322, are formed in the ILD layer 310. The dual damascene upper metal interconnect 326 and the dual damascene via 328 may be formed, for example, using a via-first process sequence as described in reference to FIG. 1A through FIG. 1J, or using a trench-first process sequence as described in reference to FIG. 2A through FIG. 2G. A dielectric slot 318 is formed in the dual damascene upper metal interconnect 326 adjacent to the dual damascene via 328, as described in reference to FIG. 1A through FIG. 1J or to FIG. 2A through FIG. 2G.

Forming the dielectric slot 318 adjacent to the dual damascene via 328 may reduce a total amount of flaring of a via hole 314 in which the dual damascene via 328 is formed, which may in turn advantageously reduce a thickness of the dual damascene liner 322 on a top surface of the lower metal interconnect 304 in the via hole 314. An electrical resistance from the dual damascene upper metal interconnect 326 through the dual damascene via 328 to the lower metal interconnect 304 may advantageously be reduced by the lower thickness of the dual damascene liner 322 on the lower metal interconnect 304, resulting from the dielectric slot 318 being formed adjacent to the via hole 314. Lateral dimensions of the dielectric slot 318 may be selected so that electrical resistance of the dual damascene upper metal interconnect 326 meets a desired value.

FIG. 3B is another view of the integrated circuit 300, showing a more complete view of the dielectric slot 318. A lateral position of the dual damascene via 328 is indicated by a dashed loop to show its lateral proximity to the dielectric slot 318. A lateral separation 330 between the dielectric slot 318 and the dual damascene via 328 is less than half a width 332 of the dual damascene via 328. In the instant example, a width 334 of the dual damascene upper metal interconnect 326 is at least twice the width 332 of the dual damascene via 328.

Figure 4A:
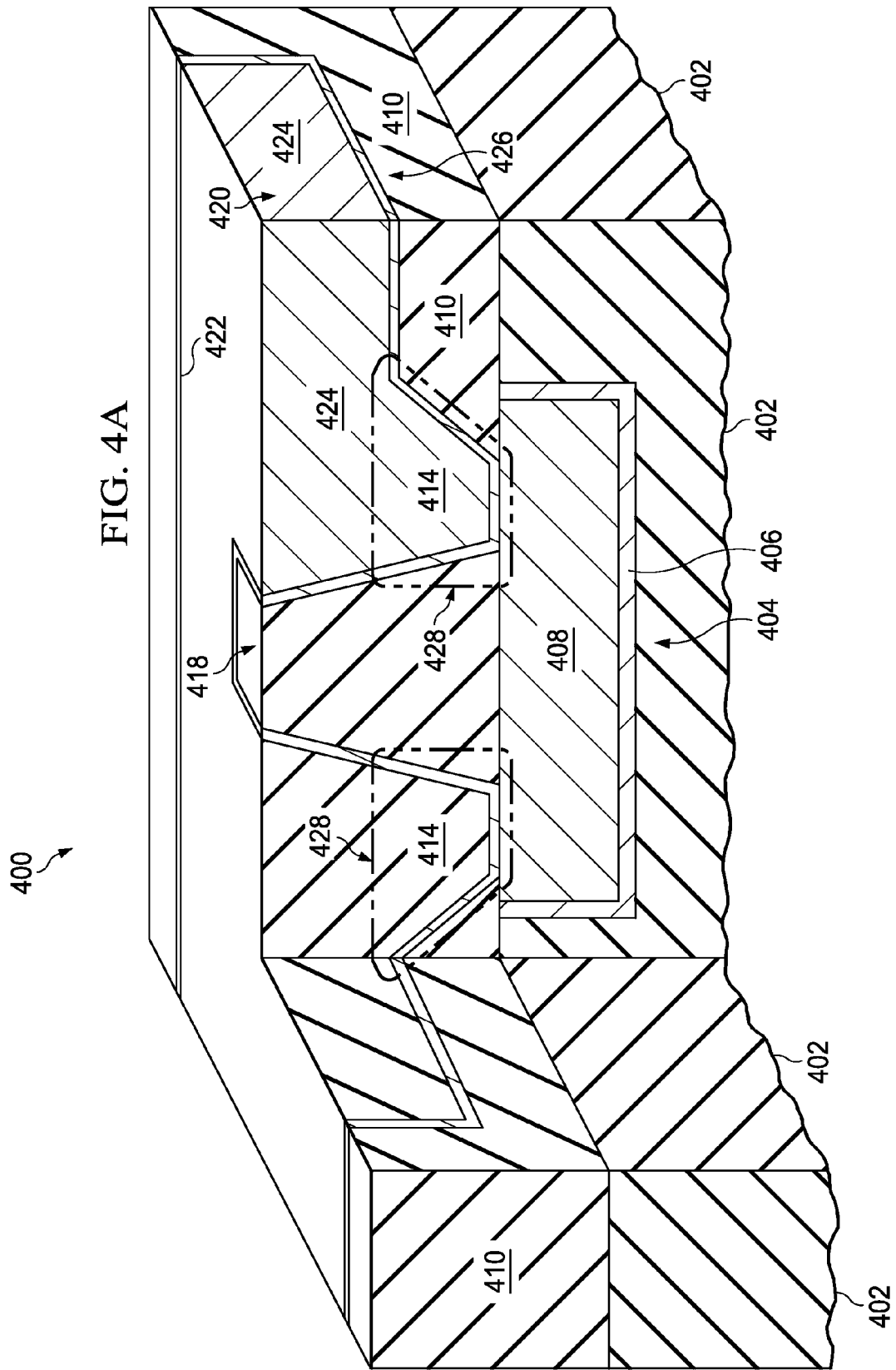
FIG. 4A and FIG. 4B are cross sections of an example integrated circuit containing a dielectric slot adjacent to two dual damascene vias.
Figure 4B:
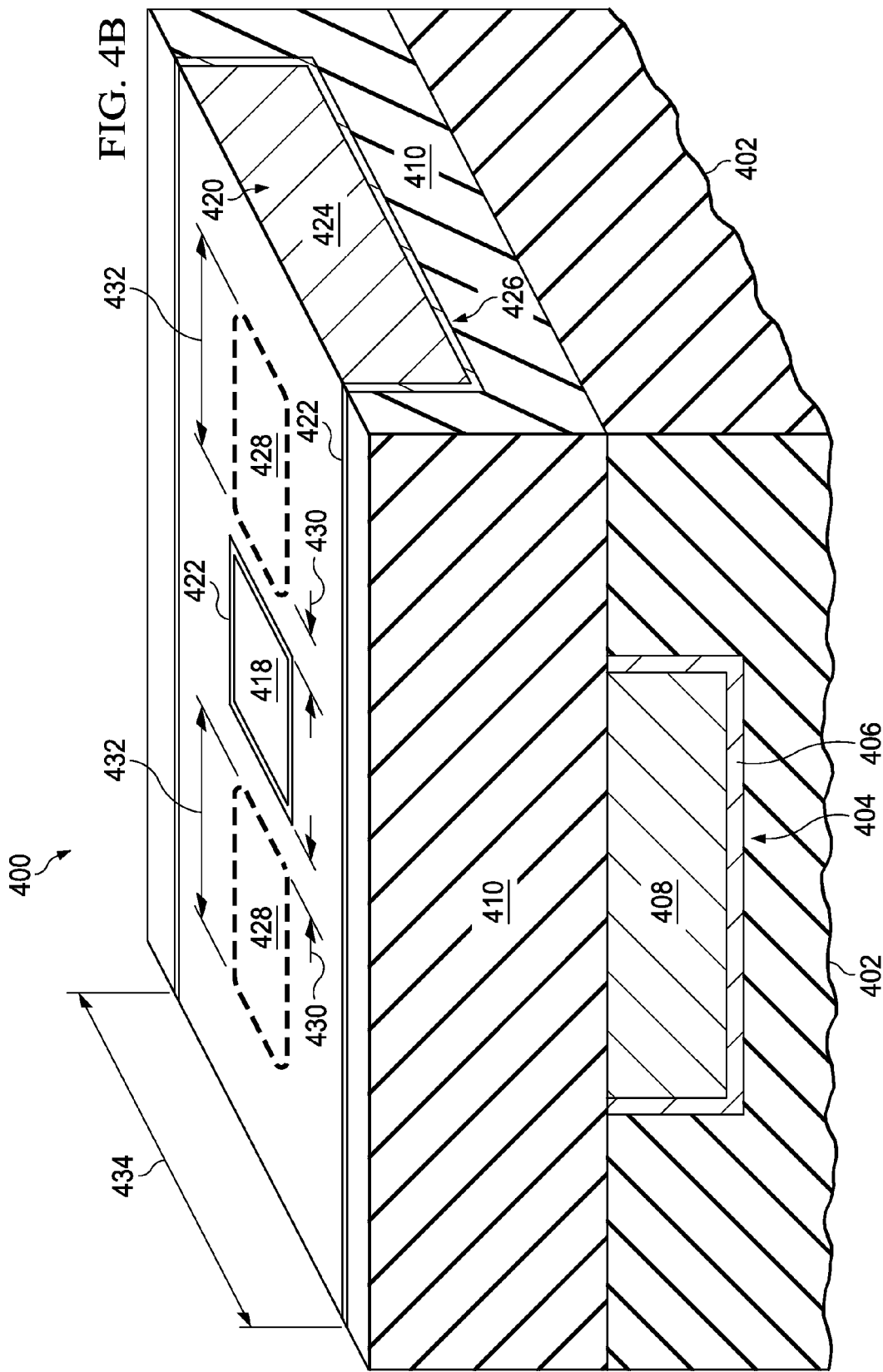

FIG. 4A and FIG. 4B are cross sections of an example integrated circuit containing a dielectric slot adjacent to two dual damascene vias. Referring to FIG. 4A, the integrated circuit 400 includes a lower dielectric layer 402 and a lower metal interconnect 404, possibly including a damascene metal liner 406 and a damascene fill metal 408, disposed in the lower dielectric layer 402, as described in reference to FIG. 1A. An ILD layer 410 is formed over the lower dielectric layer 402 and the lower metal interconnect 404.

A dual damascene upper metal interconnect 426 and two dual damascene vias 428, all of which include a dual damascene fill metal 424 and a dual damascene liner 422, are formed in the ILD layer 410. The dual damascene upper metal interconnect 426 and the dual damascene via 428 may be formed, for example, using a via-first process sequence or using a trench-first process sequence. A dielectric slot 418 is formed in the dual damascene upper metal interconnect 426 adjacent to and between the dual damascene vias 428.

Forming the dielectric slot 418 adjacent to the two dual damascene vias 428 may reduce a total amount of flaring of each via hole 414 in which each dual damascene via 428 is formed, which may in turn advantageously reduce a thickness of the dual damascene liner 422 on the lower metal interconnect 404 in the via hole 414. An electrical resistance from the dual damascene upper metal interconnect 426 through the dual damascene vias 428 to the lower metal interconnect 404 may advantageously be reduced by the lower thickness of the dual damascene liner 422 on the lower metal interconnect 404, resulting from the dielectric slot 418 being formed adjacent to the via holes 414. Lateral dimensions of the dielectric slot 418 may be selected so that electrical resistance of the dual damascene upper metal interconnect 426 meets a desired value.

FIG. 4B is another view of the integrated circuit 400, showing a more complete view of the dielectric slot 418. Lateral positions of the dual damascene vias 428 are indicated by dashed loops to show their lateral proximity to the dielectric slot 418. Lateral separations 430 between the dielectric slot 418 and the dual damascene vias 428 are less than half a width 432 of each dual damascene via 428. In the instant example, a width 434 of the dual damascene upper metal interconnect 426 is at least twice the width 432 of each dual damascene via 428.

Figure 5A:
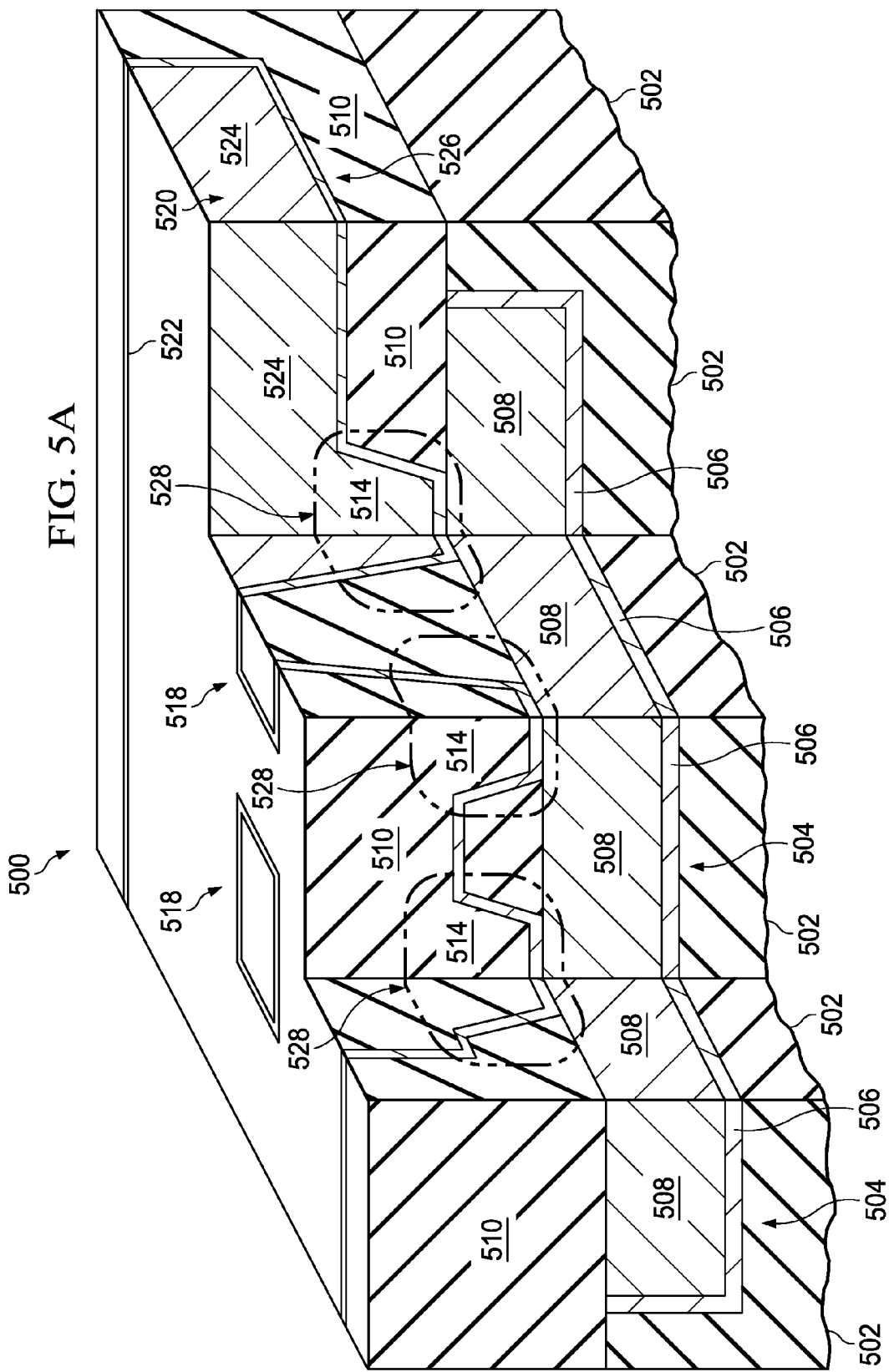
FIG. 5A and FIG. 5B are cross sections of an example integrated circuit containing two dielectric slots adjacent to four dual damascene vias.
Figure 5B:
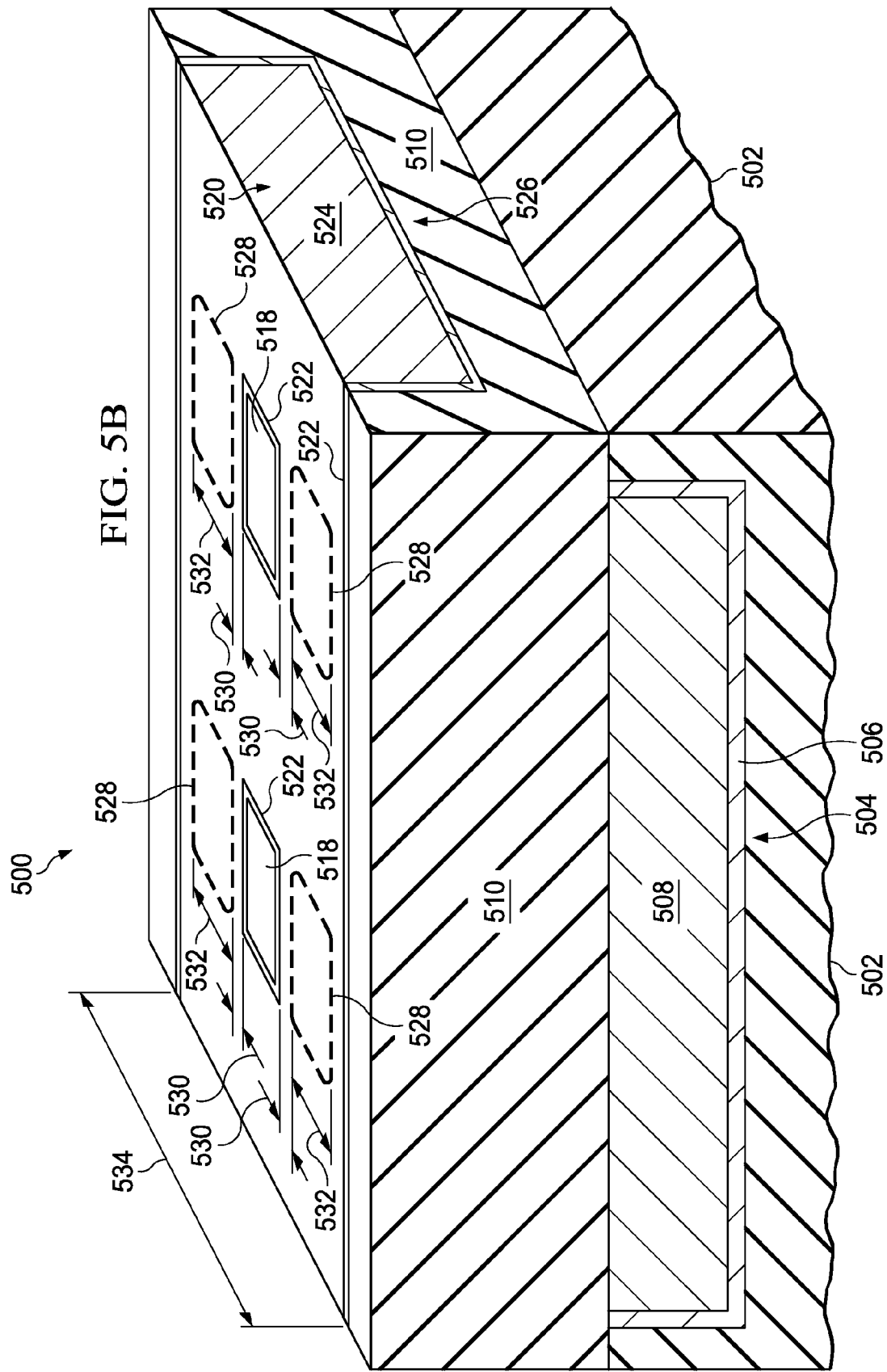

FIG. 5A and FIG. 5B are cross sections of an example integrated circuit containing two dielectric slots adjacent to four dual damascene vias. Referring to FIG. 5A, the integrated circuit 500 includes a lower dielectric layer 502 and a lower metal interconnect 504, possibly including a damascene metal liner 506 and a damascene fill metal 508, disposed in the lower dielectric layer 502, as described in reference to FIG. 1A. An ILD layer 510 is formed over the lower dielectric layer 502 and the lower metal interconnect 504.

A dual damascene upper metal interconnect 526 and four dual damascene vias 528, all of which include a dual damascene fill metal 524 and a dual damascene liner 522, are formed in the ILD layer 510. The dual damascene upper metal interconnect 526 and the dual damascene via 528 may be formed, for example, using a via-first process sequence or using a trench-first process sequence. Two dielectric slots 518 proximate to each other are formed in the dual damascene upper metal interconnect 526, each being adjacent to and between two instances of the dual damascene vias 528.

Forming each dielectric slot 518 adjacent to two dual damascene vias 528 may reduce a total amount of flaring of each via hole 514 in which each dual damascene via 528 is formed, which may in turn advantageously reduce a thickness of the dual damascene liner 522 on the lower metal interconnect 504 in the via hole 514. An electrical resistance from the dual damascene upper metal interconnect 526 through the dual damascene vias 528 to the lower metal interconnect 504 may advantageously be reduced by the lower thickness of the dual damascene liner 522 on the lower metal interconnect 504, resulting from the dielectric slots 518 being formed adjacent to the via holes 514. Lateral dimensions of the dielectric slots 518 may be selected so that electrical resistance of the dual damascene upper metal interconnect 526 meets a desired value.

FIG. 5B is another view of the integrated circuit 500, showing a more complete view of the dielectric slot 518. Lateral positions of the dual damascene vias 528 are indicated by dashed loops to show their lateral proximity to the dielectric slots 518. Lateral separations 530 between each dielectric slot 518 and the adjacent instances of the dual damascene vias 528 are less than half a width 532 of each dual damascene via 528. In the instant example, a width 534 of the dual damascene upper metal interconnect 526 is at least three times the width 532 of each dual damascene via 528.

Figure 6A:
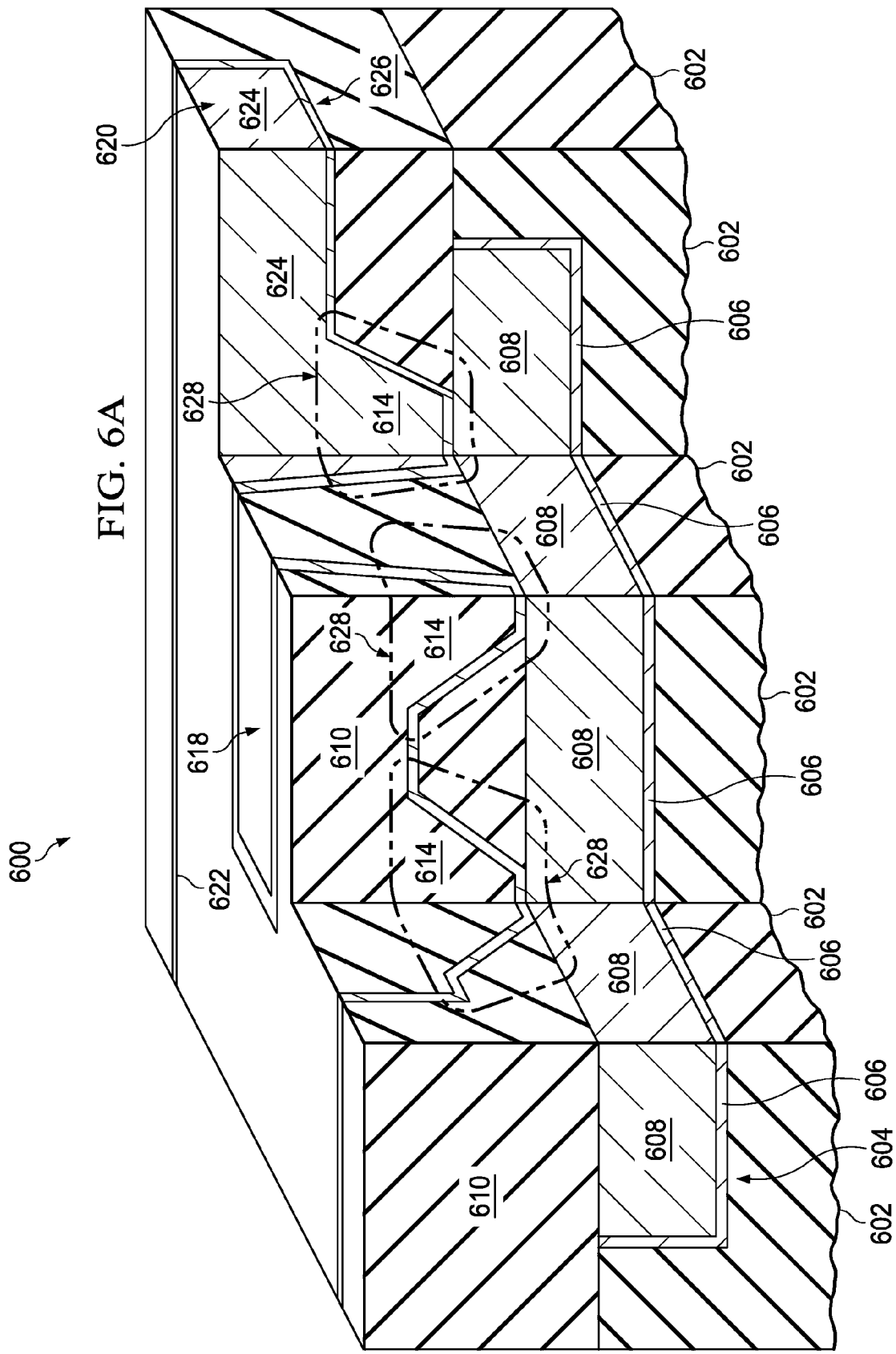
FIG. 6A and FIG. 6B are cross sections of an example integrated circuit containing a dielectric slot adjacent to four dual damascene vias.
Figure 6B:
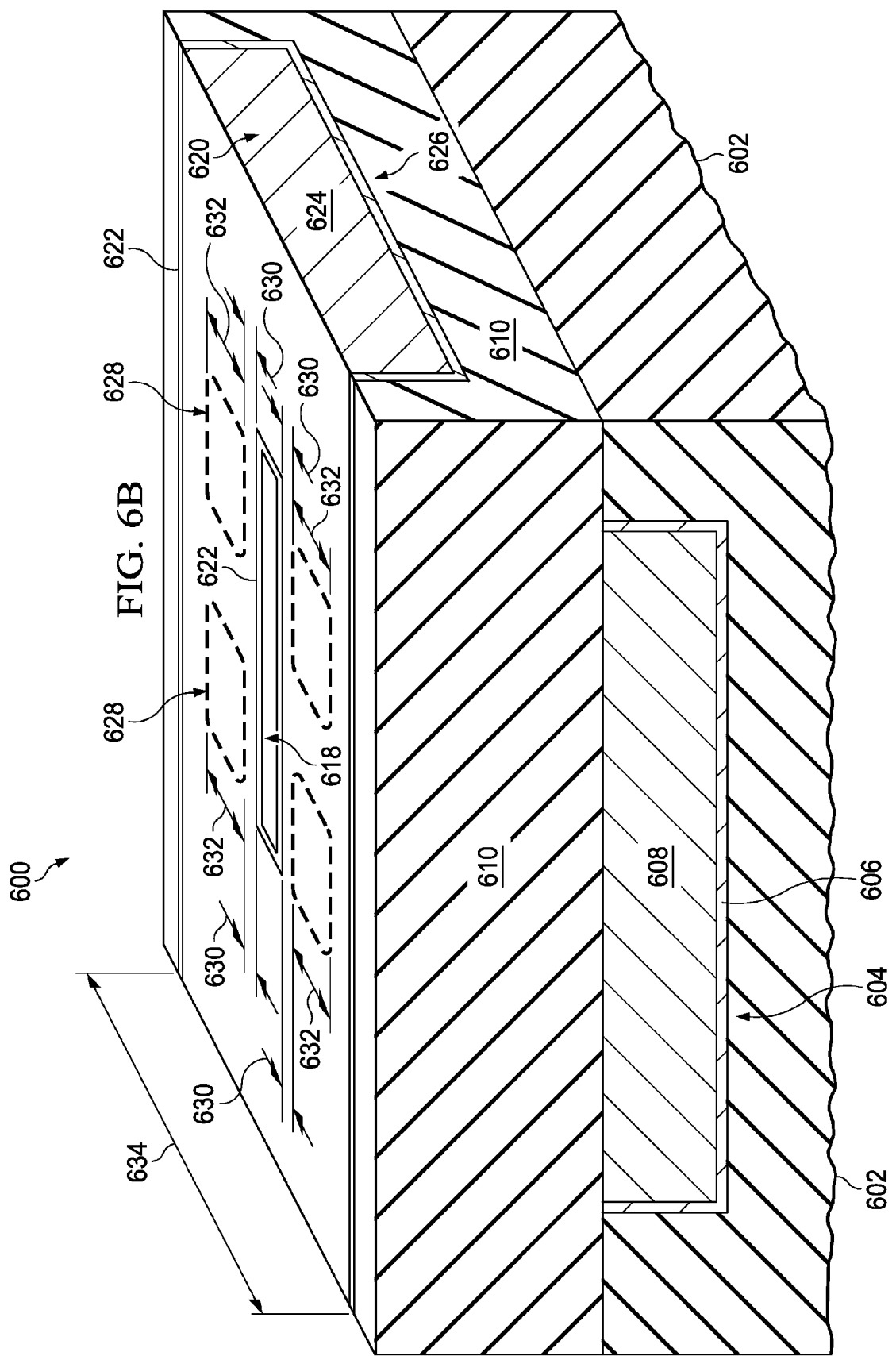

FIG. 6A and FIG. 6B are cross sections of an example integrated circuit containing a dielectric slot adjacent to four dual damascene vias. Referring to FIG. 6A, the integrated circuit 600 includes a lower dielectric layer 602 and a lower metal interconnect 604, possibly including a damascene metal liner 606 and a damascene fill metal 608, disposed in the lower dielectric layer 602, as described in reference to FIG. 1A. An ILD layer 610 is formed over the lower dielectric layer 602 and the lower metal interconnect 604.

A dual damascene upper metal interconnect 626 and four dual damascene vias 628, all of which include a dual damascene fill metal 624 and a dual damascene liner 622, are formed in the ILD layer 610. The dual damascene upper metal interconnect 626 and the dual damascene via 628 may be formed, for example, using a via-first process sequence or using a trench-first process sequence. An elongated dielectric slot 618 is formed in the dual damascene upper metal interconnect 626 adjacent to and between the dual damascene vias 628.

Forming the dielectric slot 618 adjacent to the dual damascene vias 628 may reduce a total amount of flaring of each via hole 614 in which each dual damascene via 628 is formed, which may in turn advantageously reduce a thickness of the dual damascene liner 622 on the lower metal interconnect 604 in the via hole 614. An electrical resistance from the dual damascene upper metal interconnect 626 through the dual damascene vias 628 to the lower metal interconnect 604 may advantageously be reduced by the lower thickness of the dual damascene liner 622 on the lower metal interconnect 604, resulting from the dielectric slots 618 being formed adjacent to the via holes 614. Lateral dimensions of the dielectric slots 618 may be selected so that electrical resistance of the dual damascene upper metal interconnect 626 meets a desired value.

FIG. 6B is another view of the integrated circuit 600, showing a more complete view of the dielectric slot 618. Lateral positions of the dual damascene vias 628 are indicated by dashed loops to show their lateral proximity to the dielectric slot 618. Lateral separations 630 between the dielectric slot 618 and the dual damascene vias 628 are less than half a width 632 of each dual damascene via 628. In the instant example, a width 634 of the dual damascene upper metal interconnect 626 is at least three times the width 632 of each dual damascene via 628.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
a lower dielectric layer;
a lower metal interconnect disposed in the lower dielectric layer;
an inter-level dielectric (ILD) layer disposed over the lower dielectric layer and the lower metal interconnect;
a dual damascene upper metal interconnect disposed in the ILD layer over the lower metal interconnect;
a dual damascene via disposed between the dual damascene upper metal interconnect and the lower metal interconnect, the dual damascene via making electrical connection to the lower metal interconnect, a width of the dual damascene upper metal interconnect being at least twice a width of the dual damascene via; and
a dielectric slot disposed within the dual damascene upper metal interconnect adjacent to the dual damascene via such that the dielectric slot is surrounded by the dual damascene upper metal interconnect, a lateral separation between the dielectric slot and the dual damascene via being less than half of the width of the dual damascene via.

2. The integrated circuit of claim 1, wherein:
the dielectric slot is a first dielectric slot; and
the integrated circuit comprises a second dielectric slot disposed in the dual damascene upper metal interconnect adjacent to the dual damascene via opposite from the first dielectric slot, the second dielectric slot being surrounded by the dual damascene upper metal interconnect, a lateral separation between the second dielectric slot and the dual damascene via being less than half of the width of the dual damascene via.

3. The integrated circuit of claim 1, wherein:
the dual damascene via is a first dual damascene via; and
the integrated circuit comprises a second dual damascene via disposed in the dual damascene upper metal interconnect adjacent to the dielectric slot opposite from the first dual damascene via, the second dual damascene via making electrical connection to the lower metal interconnect, a lateral separation between the second dual damascene via and the dielectric slot being less than half of the width of the second dual damascene via.

4. The integrated circuit of claim 1, wherein:
the dielectric slot is a first dielectric slot;
the integrated circuit comprises a second dielectric slot disposed in the dual damascene upper metal interconnect proximate to the first dielectric slot, the second dielectric slot being surrounded by the dual damascene upper metal interconnect;
the dual damascene via is a first dual damascene via;
the integrated circuit comprises a second dual damascene via in the dual damascene upper metal interconnect adjacent to the first dielectric slot opposite from the first dual damascene via, the second dual damascene via making electrical connection to the lower metal interconnect, a lateral separation between the second dual damascene via and the first dielectric slot being less than half of the width of the second dual damascene via;
the integrated circuit comprises a third dual damascene via in the dual damascene upper metal interconnect adjacent to the second dielectric slot, the third dual damascene via making electrical connection to the lower metal interconnect, a lateral separation between the third dual damascene via and the second dielectric slot being less than half of the width of the third dual damascene via; and
the integrated circuit comprises a fourth dual damascene via disposed in the dual damascene upper metal interconnect adjacent to the second dielectric slot opposite from the third dual damascene via, the fourth dual damascene via making electrical connection to the lower metal interconnect, a lateral separation between the fourth dual damascene via and the second dielectric slot being less than half of the width of the fourth dual damascene via.

5. The integrated circuit of claim 1, wherein:
the dual damascene via is a first dual damascene via;
the integrated circuit comprises a second dual damascene via in the dual damascene upper metal interconnect adjacent to the dielectric slot opposite from the first dual damascene via, the second dual damascene via making electrical connection to the lower metal interconnect, a lateral separation between the second dual damascene via and the dielectric slot being less than half of the width of the second dual damascene via;
the integrated circuit comprises a third dual damascene via in the dual damascene upper metal interconnect adjacent to the second dielectric slot proximate to the first dual damascene via, the third dual damascene via making electrical connection to the lower metal interconnect, a lateral separation between the third dual damascene via and the dielectric slot being less than half of the width of the third dual damascene via; and
the integrated circuit comprises a fourth dual damascene via disposed in the dual damascene upper metal interconnect adjacent to the dielectric slot opposite from the third dual damascene via, the fourth dual damascene via making electrical connection to the lower metal interconnect, a lateral separation between the fourth dual damascene via and the dielectric slot being less than half of the width of the fourth dual damascene via.

6. A method of forming an integrated circuit, comprising the steps of:
providing a lower dielectric layer having a lower metal interconnect disposed in the lower dielectric layer;
forming an ILD layer over the lower dielectric layer and the lower metal interconnect;
forming a via etch mask over the ILD layer, so that the via etch mask exposes an area for a dual damascene via over the lower metal interconnect;
removing material from the ILD layer in the area exposed by the via etch mask to form a via hole in the ILD layer;
removing the via etch mask after the via hole is formed;
forming a trench etch mask over the ILD layer so that the trench etch mask exposes an area for a dual damascene trench which includes the via hole, so that the trench etch mask covers an area for a dielectric slot adjacent to the via hole and surrounded by the area for the dual damascene trench;
removing material from the ILD layer in the area exposed by the trench etch mask to form the dual damascene trench in the ILD layer, concurrently deepening the via hole, and leaving the dielectric slot surrounded by the dual damascene trench;

removing the trench etch mask after the dual damascene trench is formed;

filling the dual damascene trench and via hole to form a dual damascene upper metal interconnect and dual damascene via, the dual damascene via providing an electrical connection between the dual damascene upper metal interconnect and the lower metal interconnect, so that a width of the dual damascene upper metal interconnect is at least twice a width of the dual damascene via, and so that a lateral separation between the dielectric slot and the dual damascene via is less than half of the width of the dual damascene via.

7. The method of claim 6, wherein:

the dielectric slot is a first dielectric slot;

the trench etch mask covers an area for a second dielectric slot adjacent to the via hole opposite from the area for the first dielectric slot, the area for the second dielectric slot being surrounded by the area for the dual damascene trench; and a lateral separation between the second dielectric slot and the dual damascene via is less than half of the width of the dual damascene via.

8. The method of claim 6, wherein:

the area for the dielectric slot;

the dual damascene via is a first dual damascene via;

the via etch mask exposes an area for a second dual damascene via over the lower metal interconnect, the area for a second dual damascene via being adjacent to the area for the dielectric slot opposite from the area for the first dual damascene via;

the via hole is a first hole, located in the area for the first dual damascene via;

the step of removing material from the ILD layer in the area exposed by the via etch mask forms a second via hole in the area for the second dual damascene via;

the area for the dual damascene trench includes the second via hole;

the step of removing material from the ILD layer in the area exposed by the trench etch mask concurrently deepens the second via hole;

the step of filling the dual damascene trench and via hole also forms the second dual damascene via, the second dual damascene via providing an electrical connection between the dual damascene upper metal interconnect and the lower metal interconnect, so that the width of the dual damascene upper metal interconnect is at least twice a width of the second dual damascene via, and so that a lateral separation between the dielectric slot and the second dual damascene via being less than half of the width of the second dual damascene via.

9. The method of claim 6, wherein:

the dielectric slot is a first dielectric slot;

the trench etch mask covers an area for a second dielectric slot proximate to the area for the first dielectric slot, the area for the second dielectric slot being surrounded by the area for the dual damascene trench;

the dual damascene via is a first dual damascene via;

the via etch mask exposes:

an area for a second dual damascene via over the lower metal interconnect, the area for the second dual damascene via being adjacent to the area for the first dielectric slot opposite from the area for the first dual damascene via;

an area for a third dual damascene via over the lower metal interconnect, the area for the third dual damascene via being adjacent to the area for the second dielectric slot and proximate to the area for the first dual damascene via; and an area for a fourth dual damascene via over the lower metal interconnect, the area for the fourth dual damascene via being adjacent to the area for the second dielectric slot opposite from the area for the third dual damascene via;

the via hole is a first hole, located in the area for the first dual damascene via;

the step of removing material from the ILD layer in the area exposed by the via etch mask forms a second via hole in the area for the second dual damascene via, a third via hole in the area for the third dual damascene via, and a fourth via hole in the area for the fourth dual damascene via;

the area for the dual damascene trench includes the second via hole, the third via hole and the fourth via hole;

the step of removing material from the ILD layer in the area exposed by the trench etch mask concurrently deepens the second via hole, the third via hole and the fourth via hole;

the step of filling the dual damascene trench and via hole also forms the second dual damascene via, the second dual damascene via providing an electrical connection between the dual damascene upper metal interconnect and the lower metal interconnect, so that the width of the dual damascene upper metal interconnect is at least twice a width of the second dual damascene via, and so that a lateral separation between the first dielectric slot and the second dual damascene via is less than half of the width of the second dual damascene via;

the step of filling the dual damascene trench and via hole also forms the third dual damascene via, the third dual damascene via providing an electrical connection between the dual damascene upper metal interconnect and the lower metal interconnect, so that the width of the dual damascene upper metal interconnect is at least twice a width of the third dual damascene via, and so that a lateral separation between the second dielectric slot and the third dual damascene via is less than half of the width of the third dual damascene via; and the step of filling the dual damascene trench and via hole also forms the fourth dual damascene via, the fourth dual damascene via providing an electrical connection between the dual damascene upper metal interconnect and the lower metal interconnect, so that the width of the dual damascene upper metal interconnect is at least twice a width of the fourth dual damascene via, and so that a lateral separation between the second dielectric slot and the fourth dual damascene via is less than half of the width of the fourth dual damascene via.

10. The method of claim 6, wherein:

the dual damascene via is a first dual damascene via;

the via etch mask exposes:

an area for a second dual damascene via over the lower metal interconnect, the area for the second dual damascene via being adjacent to the area for the dielectric slot opposite from the area for the first dual damascene via;

an area for a third dual damascene via over the lower metal interconnect, the area for the third damascene via being adjacent to the area for the dielectric slot and proximate to the area for the first dual damascene via; and an area for a fourth dual damascene via over the lower metal interconnect, the area for the fourth dual damascene via being adjacent to the area for the dielectric slot opposite from the area for the third dual damascene via;

the via hole is a first hole, located in the area for the first dual damascene via;

the step of removing material from the ILD layer in the area exposed by the via etch mask forms a second via hole in the area for the second dual damascene via, a third via hole in the area for the third dual damascene via, and a fourth via hole in the area for the fourth dual damascene via;

the area for the dual damascene trench includes the second via hole, the third via hole and the fourth via hole;

the step of removing material from the ILD layer in the area exposed by the trench etch mask concurrently deepens the second via hole, the third via hole and the fourth via hole;

the step of filling the dual damascene trench and via hole also forms the second dual damascene via, the second dual damascene via providing an electrical connection between the dual damascene upper metal interconnect and the lower metal interconnect, so that the width of the dual damascene upper metal interconnect is at least twice a width of the second dual damascene via, and so that a lateral separation between the first dielectric slot and the second dual damascene via is less than half of the width of the second dual damascene via;

the step of filling the dual damascene trench and via hole also forms the third dual damascene via, the third dual damascene via providing an electrical connection between the dual damascene upper metal interconnect and the lower metal interconnect, so that the width of the dual damascene upper metal interconnect is at least twice a width of the third dual damascene via, and so that a lateral separation between the second dielectric slot and the third dual damascene via is less than half of the width of the third dual damascene via; and the step of filling the dual damascene trench and via hole also forms the fourth dual damascene via, the fourth dual damascene via providing an electrical connection between the dual damascene upper metal interconnect and the lower metal interconnect, so that the width of the dual damascene upper metal interconnect is at least twice a width of the fourth dual damascene via, and so that a lateral separation between the second dielectric slot and the fourth dual damascene via is less than half of the width of the fourth dual damascene via.

11. A method of forming an integrated circuit, comprising the steps of:

providing a lower dielectric layer having a lower metal interconnect disposed in the lower dielectric layer;

forming an ILD layer over the lower dielectric layer and the lower metal interconnect;

forming a trench etch mask over the ILD layer so that the trench etch mask exposes an area for a dual damascene trench, so that the trench etch mask covers an area for a dielectric slot surrounded by the area for the dual damascene trench;

removing material from the ILD layer in the area exposed by the trench etch mask to form the dual damascene trench in the ILD layer and leave the dielectric slot surrounded by the dual damascene trench;

removing the trench etch mask after the dual damascene trench is formed;

forming a via etch mask over the ILD layer and in the dual damascene trench, so that the via etch mask exposes an area for a dual damascene via in the dual damascene trench adjacent to the dielectric slot and over the lower metal interconnect;

removing material from the ILD layer in the area exposed by the via etch mask to form a via hole in the ILD layer adjacent to the dielectric slot;

removing the via etch mask after the via hole is formed;

filling the dual damascene trench and via hole to form a dual damascene upper metal interconnect and a dual damascene via, the dual damascene via providing an electrical connection between the dual damascene upper metal interconnect and the lower metal interconnect, so that a width of the dual damascene upper metal interconnect is at least twice a width of the dual damascene via, and so that a lateral separation between the dielectric slot and the dual damascene via being less than half of the width of the dual damascene via.

12. The method of claim 11, wherein:

the dielectric slot is a first dielectric slot;

the trench etch mask covers an area for a second dielectric slot proximate to the area for the first dielectric slot, the area for the second dielectric slot being surrounded by the area for the dual damascene trench;

the area for the dual damascene via is adjacent to the second dielectric slot; and a lateral separation between the second dielectric slot and the dual damascene via is less than half of the width of the dual damascene via.

13. The method of claim 11, wherein:

the dual damascene via is a first dual damascene via;

the via etch mask exposes an area for a second dual damascene via in the dual damascene trench adjacent to the dielectric slot, opposite from the area for the first dual damascene via, and over the lower metal interconnect;

the via hole is a first hole, located in the area for the first dual damascene via;

the step of removing material from the ILD layer in the area exposed by the via etch mask forms a second via hole in the area for the second dual damascene via;

the step of filling the dual damascene trench and via hole forms the second dual damascene via, the second dual damascene via providing an electrical connection between the dual damascene upper metal interconnect and the lower metal interconnect, so that the width of the dual damascene upper metal interconnect is at least twice a width of the second dual damascene via, and so that a lateral separation between the dielectric slot and the second dual damascene via being less than half of the width of the second dual damascene via.

14. The method of claim 11, wherein:

the dual damascene via is a first dual damascene via;

the via etch mask exposes:

an area for a second dual damascene via in the dual damascene trench adjacent to the dielectric slot, opposite from the area for the first dual damascene via, and over the lower metal interconnect;

an area for a third dual damascene via in the dual damascene trench adjacent to the dielectric slot, proximate to the area for the first dual damascene via, and over the lower metal interconnect; and an area for a fourth dual damascene via in the dual damascene trench adjacent to the dielectric slot, opposite from the area for the third dual damascene via, and over the lower metal interconnect;

the via hole is a first hole, located in the area for the first dual damascene via;

the step of removing material from the ILD layer in the area exposed by the via etch mask forms a second via hole in the area for the second dual damascene via, a third via hole in the area for the third dual damascene via, and a fourth via hole in the area for the fourth dual damascene via;

the area for the dual damascene trench includes the second via hole, the third via hole and the fourth via hole;

the step of removing material from the ILD layer in the area exposed by the trench etch mask concurrently deepens the second via hole, the third via hole and the fourth via hole;

the step of filling the dual damascene trench and via hole forms the second dual damascene via, the second dual damascene via providing an electrical connection between the dual damascene upper metal interconnect and the lower metal interconnect, so that the width of the dual damascene upper metal interconnect is at least twice a width of the second dual damascene via, and so that a lateral separation between the dielectric slot and the second dual damascene via is less than half of the width of the second dual damascene via;

the step of filling the dual damascene trench and via hole forms the third dual damascene via, the third dual damascene via providing an electrical connection between the dual damascene upper metal interconnect and the lower metal interconnect, so that the width of the dual damascene upper metal interconnect is at least twice a width of the third dual damascene via, and so that a lateral separation between the dielectric slot and the third dual damascene via is less than half of the width of the third dual damascene via; and the step of filling the dual damascene trench and via hole forms the fourth dual damascene via, the fourth dual damascene via providing an electrical connection between the dual damascene upper metal interconnect and the lower metal interconnect, so that the width of the dual damascene upper metal interconnect is at least twice a width of the fourth dual damascene via, and so that a lateral separation between the dielectric slot and the fourth dual damascene via is less than half of the width of the fourth dual damascene via.

* * * * *